(12) United States Patent
Bush

(10) Patent No.: US 11,329,177 B2
(45) Date of Patent: May 10, 2022

(54) STABLE PEROVSKITE MODULE INTERCONNECTS

(71) Applicant: Swift Solar Inc., Redwood City, CA (US)

(72) Inventor: Kevin Alexander Bush, Golden, CO (US)

(73) Assignee: Swift Solar Inc, San Carlos, CA (US)

( * ) Notice: Subject to any disclaimer, the term of this patent is extended or adjusted under 35 U.S.C. 154(b) by 548 days.

(21) Appl. No.: 16/255,396

(22) Filed: Jan. 23, 2019

(65) Prior Publication Data

US 2020/0152394 A1   May 14, 2020

Related U.S. Application Data

(60) Provisional application No. 62/757,619, filed on Nov. 8, 2018.

(51) Int. Cl.
| | |
|---|---|
| *H01L 31/0465* | (2014.01) |
| *H01L 31/0687* | (2012.01) |
| *H01L 31/02* | (2006.01) |
| *H01G 9/20* | (2006.01) |
| *H01L 51/44* | (2006.01) |

(52) U.S. Cl.
CPC ....... *H01L 31/0465* (2014.12); *H01G 9/2009* (2013.01); *H01L 31/02021* (2013.01); *H01L 31/0687* (2013.01); *H01L 51/442* (2013.01)

(58) Field of Classification Search
CPC .............................. H01G 9/2009; H01L 51/442
See application file for complete search history.

(56) References Cited

U.S. PATENT DOCUMENTS

| | | |
|---|---|---|
| 6,690,041 B2 | 2/2004 | Armstrong et al. |
| 2002/0144724 A1 | 10/2002 | Kilmer et al. |
| 2002/0164834 A1 | 11/2002 | Boutros et al. |
| 2005/0121068 A1 | 6/2005 | Sager et al. |
| 2010/0282291 A1 | 11/2010 | Goto et al. |
| 2011/0023954 A1 | 2/2011 | Jung |
| 2011/0265857 A1 | 11/2011 | Wang et al. |
| 2011/0284986 A1 | 11/2011 | Rim et al. |
| 2012/0055544 A1* | 3/2012 | Ahn ............... H01L 31/0465 136/256 |

(Continued)

FOREIGN PATENT DOCUMENTS

| | | |
|---|---|---|
| CN | 102637700 A | 8/2012 |
| EP | 1443566 A1 | 8/2004 |

(Continued)

OTHER PUBLICATIONS

Sanehira et al., "Influence of Electrode Interfaces on the Stability of Perovskite Solar Cells: Reduced Degradation Using MoOx/Al for Hole Collection", ACS Energy Lett. 2016, 1, 38-45. (Year: 2016).*

(Continued)

*Primary Examiner* — Tae-Sik Kang
(74) *Attorney, Agent, or Firm* — Aikin & Gallant, LLP

(57) ABSTRACT

Thin-film solar cell modules and serial cell-to-cell interconnect structures and methods of fabrication are described. In an embodiment, solar cell module and interconnect includes a conformal transport layer over a subcell layer. The conformal transport layer may also laterally surround an outside perimeter the subcell layer.

18 Claims, 31 Drawing Sheets

(56) References Cited

U.S. PATENT DOCUMENTS

| | | |
|---|---|---|
| 2013/0008496 A1 | 1/2013 | Jee |
| 2014/0261657 A1 | 9/2014 | Cheng et al. |
| 2014/0261674 A1 | 9/2014 | Youngbull et al. |
| 2015/0007866 A1 | 1/2015 | Karst et al. |
| 2015/0020864 A1 | 1/2015 | Dufoureq et al. |
| 2015/0228415 A1 | 8/2015 | Seok et al. |
| 2016/0196927 A1 | 7/2016 | Bryant et al. |
| 2016/0233439 A1* | 8/2016 | Burschka .............. H01L 51/002 |
| 2017/0077402 A1 | 3/2017 | Oooka et al. |
| 2017/0194102 A1 | 7/2017 | Huang et al. |
| 2018/0174761 A1 | 6/2018 | Kamino et al. |
| 2019/0074461 A1* | 3/2019 | Ding ..................... H01L 27/301 |
| 2020/0152394 A1 | 5/2020 | Bush |
| 2020/0152812 A1 | 5/2020 | Bush |

FOREIGN PATENT DOCUMENTS

| | | |
|---|---|---|
| JP | 2005268719 A | 9/2005 |
| JP | 2014179374 A | 9/2014 |
| KR | 10-2018-0051019 | 5/2018 |
| WO | 2016186317 | 11/2016 |
| WO | 2020101494 A1 | 5/2020 |

OTHER PUBLICATIONS

Fields et al., "Printed interconnects for photovoltaic modules", Solar Energy Materials & Solar Cells 159 (2017) 536-545. (Year: 2017).*

PCT/US2019/059078 "International Search Report and Written Opinion" dated Apr. 10, 2020, 12 pages.

Bush, Kevin A. et al., "23.6%-efficient monolithic perovskite/silicon tandem solar cells with improved stability", nature energy, published Feb. 17, 2017, vol. 2, Article No. 17009, 7 pgs.

Jacobs, Daniel A. et al., "A re-evaluation of transparent conductor requirements for thin-film solar cells", Royal Society of Chemistry, Paper, Journal of Materials Chemistry A, published Feb. 25, 2016, pp. 4490-4496 (7 pgs. total).

Chen, Han et al., "A solvent-and vacuum-free route to large-area perovskite films for efficient solar modules", Letter, doi:10.1038/nature23877, 2017, vol. 000, 15pgs.

Song, Zhaoning et al., "A technoeconomic analysis of perovskite solar module manufacturing with low-cost materials and techniques", Royal Society of Chemistry, Analysis, Energy & Environmental Science, published May 12, 2017, pp. 1297-1305 (13 pgs. total).

Horowitz, Kelsey A.W. et al., "An analysis of glass-glass CIGS manufacturing costs", Elsevier, Solar Energy Materials & Solar Cells 154, 2016, 10 pgs.

Boyd, Caleb C. et al., "Barrier Design to Prevent Metal-Induced Degradation and Improve Thermal Stability in Perovskite Solar Cells", ACS Energy Letters, 2018, pp. 1772-1778 (7 pgs. total).

Cheacharoen, Rongrong et al., "Design and understanding of encapsulated perovskite solar cells to withstand temperature cycling", Royal Society of Chemistry, Paper, Energy & Environmental Science, published Oct. 20, 2017, 7 pgs.

Kaltenbrunner, Martin, "Flexible high power-per-weight perovskite solar cells with chromium oxide-metal contacts for improved stability in air", nature materials, published Aug. 24, 2015, DOI:10.1038/NMAT4388, pp. 1032-1041 (10 pgs. total).

Grancini, G. et al., "One-Year stable perovskite solar cells by 2D/3D interface engineering", nature communications, Article, published Jun. 1, 2017, DOI:10.1038/ncomms15684, 8 pgs.

Yang, Mengjin et al., "Highly Efficient Perovskite Solar Modules by Scalable Fabrication and Interconnection Optimization", ACS Energy Letters, Letter, published 2018, pp. 322-328 (7 pgs. total).

Pisoni, Stefano et al., "Impact of interlayer application on band bending for improved electron extraction for efficient flexible perovskite mini-modules", Elsevier, Nano Energy, published 2018, pp. 300-307 (8 pgs. total).

You, Jingbi et al., "Improved air stability of perovskite solar cells via solution-processed metal oxide transport layers", nature nanotechnology, Articles, vol. 11, published online: Oct. 12, 2015, DOI:10.1038/NNANO.2015.230, pp. 75-82 (8 pgs. total).

Jones-Albertus, Rebecca et al., "Technology advances needed for photovoltaics to achive widespread grid price parity", Progress in Photovoltaics, piblished 2016, DOI:10.1002/pip.2755, pp. 1272-1283 (12 pgs. total).

Kato, Yuichi et al., "Silver Iodide Formation in Methyl Ammonium Lead Iodide Perovskite Solar Cells with Silver Top Electrodes", Advanced Materials Interfaces, Full Paper, published 2015, 6 pgs.

Domanski, Konrad et al., "Not All That Glitters Is Gold: Metal-Migration-Induced Degradation in Perovskite Solar Cells", ACS Nano, Article, published 2016, DOI:10.1021/acsnano.6b02613, pp. 6306-6314 (9 pgs. total).

Palma, Alessandro Lorenzo et al., "Laser-Patterning Engineering for Perovskite Solar Modules With 95% Aperture Ratio", IEEE Journal of Photovoltaics, published 2017, 7 pgs.

Fields, J.D. et al., "Printed interconnects for photovoltaic modules", Elsevier, Solar Energy Materials & Solar Cells 159 (2017) pp. 536-545, (10 pgs. total).

Crozier, M.L. et al., "Recent developments toward a one step thin-film PV interconnection process using laser scribing and inkjet printing", ResearchGate, Conference Paper, published Jun. 2014, DOI:10.1109/PVSC.2014.6925507, pp. 2784-2788 (6 pgs. total).

Li, Zhen et al., "Scalable fabrication of perovskite solar cells", Nature Reviews, Materials, vol. 3, Article No. 18017, published online Mar. 27, 2018, doi:10.1038/naturevmats.2018.17, 20 pgs.

Wilkinson, Ben et al., "Scaling limits to large area perovskite solar cell efficiency", EU PVSEC Paper, Progress in Photovoltaics, Wiley & Sons Ltd., 2018, DOI:10.1002/pip.3035, pp. 659-674 (16 pgs. total).

Christians, Jeffrey A. et al., "Stability at Scale: Challenges of Module Interconnects for Perovskite Photovoltaics", ACS Energy Letters, Energy Express, published 2018, DOI:10.11021/acsenergylett.8b01498, pp. 2502-2503 (2 pgs. total).

Brinkmann, K.O. et al., "Suppressed decomposition of organometal halide perovskites by impermeable electron-extraction layers in inverted solar cells", nature communications, Article, Published Jan. 9, 2017, DOI:10.1038/ncomms 13938, 9 pgs.

Bush, Kevin A. et al., "Thermal and Environmental Stability of Semi-Transparent Perovskite Solar Cells for Tandems Enabled by a Solution-Processed Nanoparticle Buffer Layer and Sputtered ITO Electrode", Advanced Materials, Materials Views, Communication, published 2016, DOI:10.1002/adma.201505279, pp. 3937-3943 (7 pgs. total).

Rowell, Michael W., et al., "Transparent electrode requirements for thin film solar cell modules", Energy & Environmental Science, Communication, Published on Nov. 5, 2010, The Royal Society of Chemistry, DOI:10.1039/c0ee00373e, 4 pgs.

Powalla, Dr.-Ing.Michael, "Development of Materials and Processes for the Production of Solar Modules, The Sequence of Processing Steps for the Production of a Cu(In,Ga)Se2 Thin-Film Solar Module", Zentrum fur Sonnenenergie- und Wasserstoff-Forschung (ZSW), Jun. 2008, Germany, 1 pg.

Eperon, Giles E. et al., "Perovskite-perovskite tandem photovoltaics with optimized bandgaps", ResearchGap, Article in Science, Oct. 2016, DOI:10.1126/science.aaf9717, 10 pgs.

Heise, Gerhard et al., "Monolithical Serial Interconnects of Large CIS Solar Cells with Picosecond Laser Pulses", Elsevier, Physics Procedia, ScienceDirect, LiM 2011, pp. 149-155 (7 pgs. total).

Gehlhaar, Robert et al., (2015). "Perovskite solar modules with minimal area loss interconnections", SPIE Newsroom. 10.1117/2.1201509.006116., 3 pgs.

Silverman, Timothy J., et al., "Thermal and Electrical Effects of Partial Shade in Monolithic Thin-Film Photovoltaic Modules" IEEE Journal of Photovoltaics, vol. 5, No. 6, Nov. 2015, 6 pages.

Silvestre, S., et al. "Study of Bypass Diodes Configuration on PV Modules" Applied Energy 86, (2009), Elsevier, pp. 1632-1640, 9 pgs. total.

Dongaonkar, S. et al. "Performance and Reliability Implications of Two-Dimensional Shading in Monolithic Thin-Film Photovoltaic Modules," IEEE Journal of Photovoltaics, vol. 3, No. 4, Oct. 2013, pp. 1367-1375, 9 pgs. total.

(56) References Cited

OTHER PUBLICATIONS

Unknown Author, "Module Shading Guide" First Solar, Inc., 2017, PD-5-367 Rev. 1.0, 8 pages.
Jones-Albertus, R., et al. "Technology advances needed for photovoltaics to achieve widespread grid price parity" Progress in Photovoltaics: Research and Applications, Wiley Online Library, Apr. 20, 2016, pp. 1272-1283, 12 pgs. total.
Steim, Roland et al. "Flexible polymer photovoltaic modules with incorporated organic bypass diodes to address module shading effects", Solar Energy Materials & Solar Cells 93 (2009), Elsevier, pp. 1963-1967, 5 pgs. total.
Saha, B. et al. "Schottky diode behaviour with excellent photoresponse in NiO/FTO heterostructure", Applied Surface Science 418 (2017), Elsevier, pp. 328-334, 7 pgs. total.
PCT/US2020/020481, "PCT International Search Report" dated Jun. 24, 2020, 3 pages.
Leijtens, Thomas et al., "Opportunities and challenges for tandem solar cells using metal halide perovskite semiconductors," Nature Energy 3, 828-838 (2018) https://doi.org/10.1038/S41560-018-0190-4, 11 pages.
Bermudez Veronica Et Al: "Understanding the cell-to-module efficiency gap in Cu(In,Ga) (S,Se)2 photovoltaics scale-up", Nature Energy, Nature Publishing Group UK, London, vol. 3, No. 6, Jun. 8, 2018 (Jun. 8, 2018), pp. 466-475.
19881327.1, "The Extended European Search Report" dated Feb. 1, 2022, 11 pages.

\* cited by examiner

STABLE PEROVSKITE MODULE INTERCONNECTS

RELATED APPLICATIONS

This application claims the benefit of priority of U.S. Provisional Application No. 62/757,619 filed Nov. 8, 2018 which is incorporated herein by reference.

BACKGROUND

Field

Embodiments described herein relate to solar cells, and more particularly to interconnect structures for perovskite solar cell modules.

Background Information

Photovoltaic cells, also referred to solar cells, are devices that convert radiant photo energy into electrical energy. Multiple solar cells may be integrated into a group to constitute a solar panel, or module, in which the solar cells are usually connected in series creating an additive voltage.

Monocrystalline solar cells are dominant in the current solar cell industry, offering some of the highest efficiencies and lifetimes. However, the cost associated monocrystalline solar cells is a driving factor in the development of alternative solar cell technologies. One class of development is thin-film solar cells. Thin-film solar cells are attractive due to the potential to implement economical in-line processes of deposition and patterning sequences. As thin-film solar cells continue to improve in efficiency they may be candidates to displace currently adopted monocrystalline solar cells at a reduced cost, or create new solar cell markets. Furthermore, some thin-film solar cells can be flexible with potential applications on curved surfaces, mobile devices, or other components. Two such emerging thin-film technologies include cadmium telluride (CdTe) and copper indium gallium selenide (CIGS). More recently perovskite solar cells have gained attention with a rapid surge in reported cell efficiency.

SUMMARY

Thin-film solar cell modules and serial cell-to-cell interconnect structures and methods of fabrication are described. In particular embodiments describe structures and fabrication sequences that may protect the integrity of the subcell absorber material, such as a metal-halide perovskite, from decomposition and allow the integration of adjacent metal layers.

In an embodiment a solar cell module includes a bottom electrode layer with a plurality of first patterned line openings, a subcell layer over the bottom electrode layer, the subcell layer including a plurality of second patterned line openings, a conformal transport layer over subcell layer and laterally surrounding an outside perimeter the subcell layer, and a patterned top electrode layer over the conformal transport layer. The conformal transport layer may encapsulate the subcell layer to prevent perovskite-metal contact and perovskite decomposition. In an embodiment, a non-metallic intermediate layer, which may be an insulator layer, is located between the conformal transport layer and the subcell layer, with the non-metallic intermediate layer laterally surrounding the outside perimeter of the subcell layer. In such a configuration the conformal transport layer may also surround an outside perimeter of the non-metallic intermediate layer.

In an embodiment, a solar cell interconnect includes a bottom electrode layer on a substrate, a first patterned line opening P1 in the bottom electrode layer, a subcell layer over the bottom electrode layer and within the first patterned line opening P1, a second patterned line opening P2 in the subcell layer, a non-metallic intermediate layer along sidewalls of the second patterned line opening P2, a conformal transport layer over the subcell layer, on the non-metallic intermediate layer within the second patterned line opening P2 and over the bottom electrode layer within the second patterned line opening P1, and a top electrode layer over the conformal transport layer and on the conformal transport layer within the second patterned line opening P2. A third patterned line opening P3 may additionally be formed through at least the top electrode layer.

In an embodiment, a solar cell interconnect includes a bottom electrode layer, a first patterned line opening P1 in the bottom electrode layer, a subcell layer over the bottom electrode layer, a second patterned line opening P2 in the subcell layer, a conductive plug within P2, a conformal transport layer over the subcell layer and the conductive plug, a top electrode layer over the conformal transport layer, and a third patterned line opening P3 in the top electrode layer. The conductive plug may substantially fill P2 in an embodiment. In another embodiment, a non-metallic intermediate layer may be formed along a single sidewall of P2. More specifically, the non-metallic intermediate layer may be formed along a single sidewall of P1 that is shared with P1.

In an embodiment, a solar cell interconnect includes a bottom electrode layer, a first patterned line opening P1 in the bottom electrode layer, a subcell layer over the bottom electrode layer, a conformal transport layer over the subcell layer, a top electrode layer over the conformal transport layer, and a second patterned line opening P2 through the top electrode layer, the conformal transport layer and the subcell layer. A conductive plug is located within the second patterned line opening. In another embodiment, a non-metallic intermediate layer may be formed along one or more sidewalls of P2.

The top electrode layer in accordance with embodiments may include a metal layer. The conformal transport layer may provide a physical barrier between the subcell layer and top electrode layer. Additionally, various configurations are possible for forming a third patterned line opening P3 in the top electrode layer to avoid metal contact with the subcell layer. In some embodiments the top electrode layer may be patterned with a shadow mask. In some embodiments the top electrode layer and underlying layers may be patterned by scribing through the top electrode layer and into underlying layers. The P3 scribe may be filled with a non-electrically conductive. The P3 scribe may possibly extend into the non-metallic intermediate layer. In some embodiments P1 and P2 do not overlap. In other embodiments, P2 overlaps P1.

DETAILED DESCRIPTION

Embodiments describe interconnect structure for thin film solar cell modules, and in particular metal-halide perovskite-based solar cells. In various aspects, embodiments describe interconnect structures and thin-film fabrication methods that allow for economical in-line processing sequences, and the use of a metal rear electrode, which can provide rear reflection for light harvesting, low cost, and high conductivity. It has been observed that the performance and stability of metal-halide perovskite-based solar cells are highly susceptible to metal induced degradation caused by halide-metal interactions. Specifically, metal electrodes may react with halides in the perovskite and act as a sink for halides and corrosion of the metal electrode, degrading conductivity. In accordance with various embodiments, solar cell module interconnect structures are described in which a conformal transport layer may also function as a barrier layer to prevent perovskite-metal contact and the damage of the subcell structure. Furthermore, the interconnect structures in accordance with embodiments may act to prevent the ingress of moisture and oxygen and egress of volatile organic components, which may significantly increase the stability of metal-halide perovskite-based solar cells.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", and "on" as used herein may refer to a relative position of one layer with respect to other layers. One layer "over", or "on" another layer or in "contact" with another layer may be directly in contact with the other layer or may have one or more intervening layers. One layer "between" layers may be directly in contact with the layers or may have one or more intervening layers.

Figure 1:
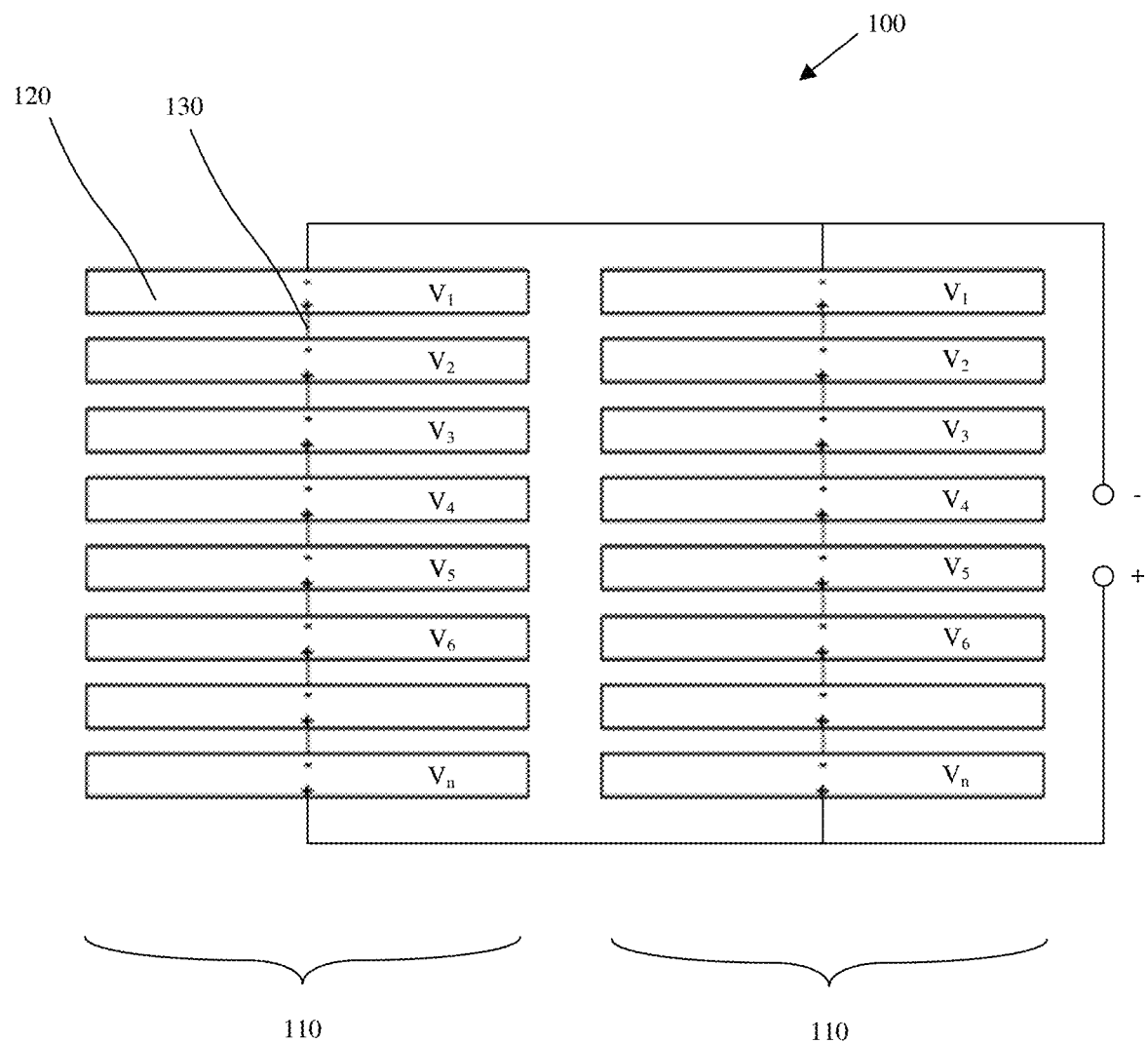
FIG. 1 is a schematic top view illustration of a solar cell module in accordance with embodiments.

Referring now to FIG. 1 a schematic top view illustration is provided of a solar cell module in accordance with embodiments. As shown, the module 100 includes a plurality of cells 120 (also referred to as solar cells) coupled in series with interconnects 130, with the front of one cell connected to the rear of the next cell so that their voltages ($V_1 \ldots V_n$) add. The plurality of cells 120 may be arranged into one or more subsets 110 (e.g. strings) coupled in parallel, which may have the effect of decreasing total module voltage.

A thin-film solar cell 120 commonly includes a subcell between two electrodes, at least one of which being transparent. As described in more detail with regard to FIGS. 3A-3B and FIGS. 4A-4B, the subcell may commonly include an absorber layer and one or more transport layers (e.g. hole transport, electron transport). The subcells in accordance with embodiments can include a single junction, or a multiple junction structure with multiple absorber layers. In order to minimize loss due limited conductivity of the transparent electrode, the module is divided into the plurality of smaller cells 120 which are electrically connected in series. The serial interconnect methodologies in accordance with embodiments may generally include a plurality of patterned line openings (P1, P2, P3, etc.) to form interconnects 130, such as a first patterned line opening P1 through a bottom electrode, a second patterned line opening P2 through the subcell which includes the absorber and transport layer(s), and a third patterned line opening P3 through a top/rear electrode to electrically isolate adjacent cells 120.

Figure 2A:
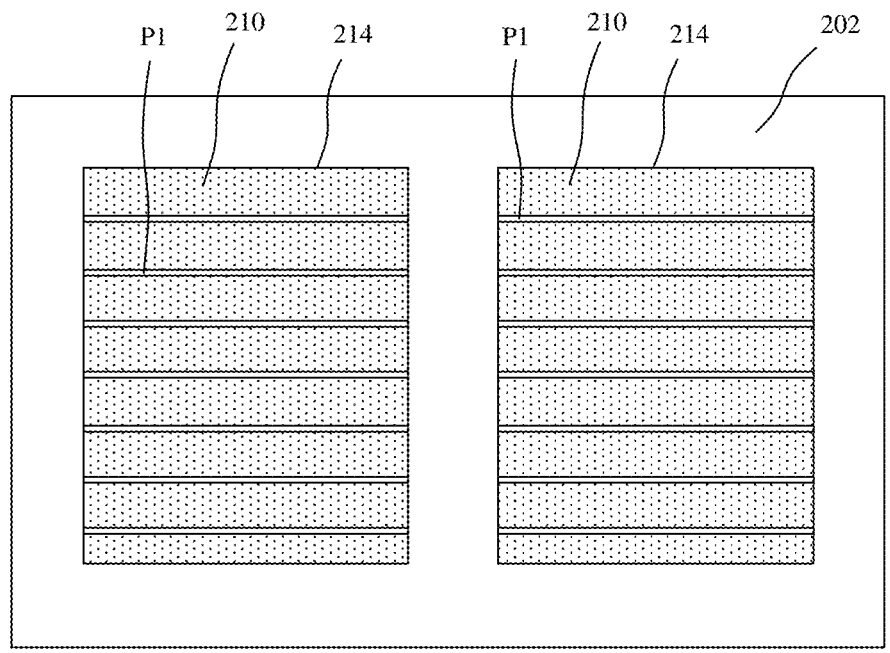
FIGS. 2A-2D are schematic top view illustrations of a method of fabricating a solar cell module in accordance with embodiments.
Figure 2B:
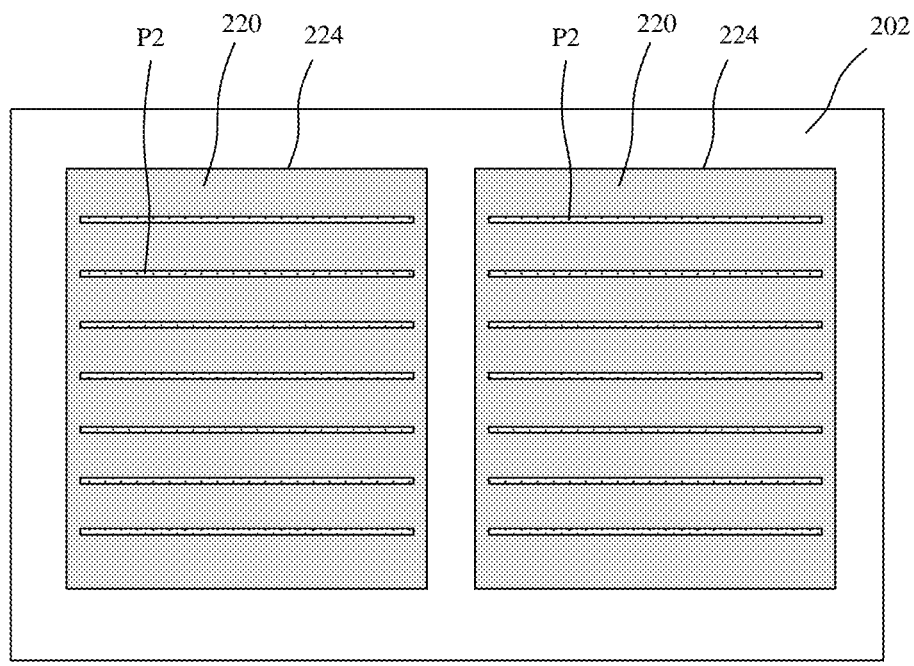
Figure 2C:
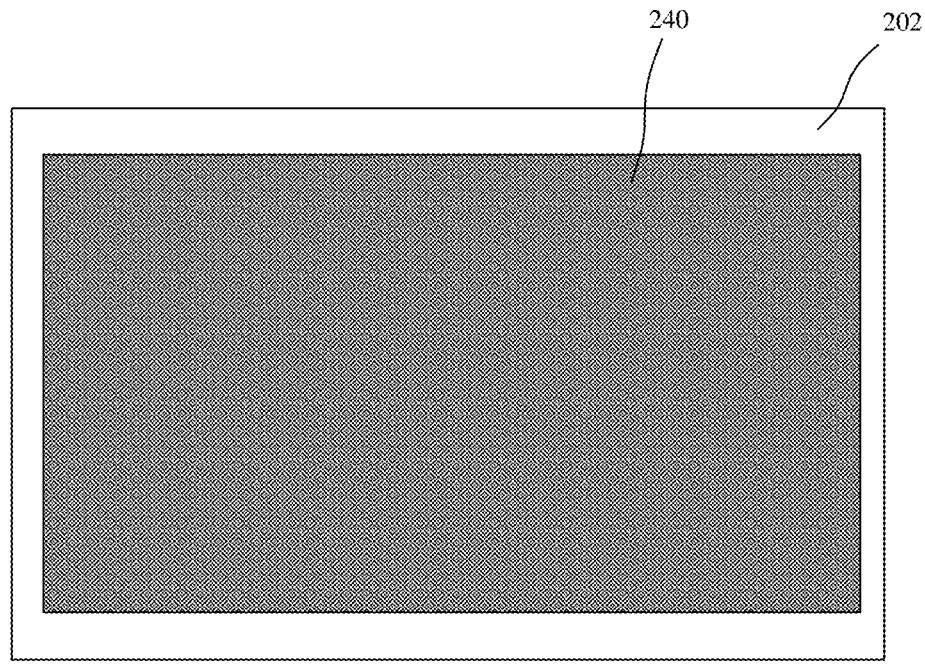

Referring now to FIGS. 2A-2D, schematic top view illustrations are provided of a method of fabricating a solar cell module 100 in accordance with embodiments. As shown in FIG. 2A, the sequence may begin with the formation of one or more bottom electrode layers 210 on a substrate. In the particular embodiment illustrated two bottom electrode layers 210 are illustrated for the fabrication of two subsets 110 that may be coupled in parallel as described with regard to FIG. 1. Each bottom electrode layer 210 includes an outside perimeter 214 and may be patterned to form first patterned line openings P1. A subcell layer 220 may then be formed over the patterned bottom electrode layer 210, followed by patterning of second patterned line openings P2 as illustrated in FIG. 2B. As shown, the subcell layer 220 may optionally be wider than the bottom electrode layer 210 such that it surrounds the bottom electrode layer. In some embodiments, the outside perimeter 224 of the subcell layer 220 may be aligned with the outside perimeter 214 of the bottom electrode layer 210, or laterally surround the outside perimeter 224 of the subcell layer. Alternatively, the subcell layer 220 may have the same width of the bottom electrode layer 210, which may provide encapsulation function for the subcell layer 220. Referring now to FIG. 2C a conformal transport layer is formed over the subcell layers 220. This may be a single transport layer or multiple layers corresponding to the subcell layers. In accordance with embodiments, a continuous conformal transport layer 240 is formed over the subcell layer 220 and second patterned line openings P2 that separate the individual cells 120. The conformal transport layer 240 may function to transport charge through its thickness, and not be laterally conductive so as to not short adjacent cells 120. In an embodiment, the conformal transport layer 240 is characterized by a resistivity greater than 0.1 ohm·cm.

Figure 2D:
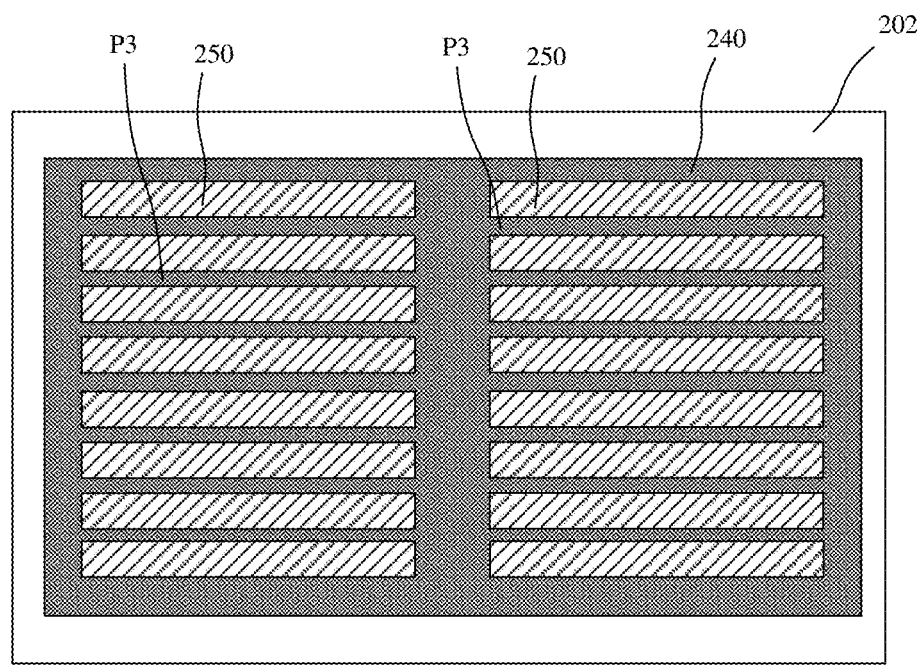

It has been observed that perovskite materials are prone to decomposition at elevated temperatures, and in particular the A-site cation of $ABX_3$ metal-halide perovskites. Additionally, perovskite materials are highly susceptible to metal induced degradation caused by halide-metal interactions. In accordance with embodiments, a conformal transport layer 240 may be used to protect against either of decomposition and metal induced degradation due to diffusion from a metal electrode. In accordance with embodiments, the conformal transport layer 240 may encapsulate a subcell layer 220 that includes a perovskite material absorber layer. In an embodiment, the conformal transport layer 240 laterally surrounds the outside perimeter 224 of the subcell layer 220, or at least the perovskite material absorber layer of the subcell layer 220. The conformal transport layer 240 may also be formed within the patterned line openings P2 in the subcell layer 220. Following the formation of the conformal transport layer 240, a patterned top electrode layer 250 is formed over the conformal transport layer 240 as illustrated in FIG. 2D, with the third patterned line openings P3 though the top electrode layer 250 separating top electrodes of adjacent cells 120.

In an embodiment, a solar cell module 100 includes a bottom electrode layer 210 including a plurality of first patterned line openings P1, a subcell layer 220 over the bottom electrode layer 210, the subcell layer 220 including a plurality of second patterned line openings P2, a conformal transport layer 240 over subcell layer 220 and laterally surrounding an outside perimeter 224 the subcell layer 220, and a patterned top electrode layer 250 over the conformal transport layer 240. In an embodiment, the patterned top electrode layer 250 includes a metal layer, and the bottom electrode layer 210 a transparent material. Exemplary transparent bottom electrode materials include poly(3,4-ethylenedioxythiophene) polystyrene sulfonate (PEDOT:PSS), transparent conductive oxides (TCOs) such as indium tin oxide (ITO), fluorine doped tin oxide (FTO), indium zinc oxide (IZO), aluminum doped zinc oxide (AZO), cadmium stannate, etc. In an embodiment, a non-metallic intermediate layer is located between the conformal transport layer 240 and the subcell layer 220, the non-metallic intermediate layer laterally surrounding the outside perimeter 224 of the subcell layer 220. In an embodiment, the conformal transport layer 240 is additionally located within the plurality of second patterned line openings P2. Exemplary conformal transport layer materials include oxides (e.g. metal oxides), nitrides (e.g. metal nitrides), polymers, and small molecules. Exemplary metal oxides may be titanium oxide, zinc oxide, tin oxide, nickel oxide, vanadium oxide, tungsten oxide, indium oxide, any of which may be doped. For example, some TCOs may be ITO, AZO, IZO cadmium stannate. Exemplary metal nitrides include at least titanium nitride and tungsten nitride. Some exemplary polymers include poly(triaryl amine) (PTAA) and polyaniline. Some exemplary small molecules include 2,2',7,7'-Tetrakis[N,N-di(4-methoxyphenyl)amino]-9,9'-spirobifluorene (spiro-MeO-TAD), and fullerenes. In an embodiment, the conformal transport layer is less than 1,000 nm thick, such as less than 150 nm thick, or more specifically less than 50 nm thick such as 10-40 nm thick. In a specific implementation, the conformal transport layer 240 is formed of aluminum doped zinc oxide (AZO). The aluminum doping concentration need not create a high conductivity, and instead may be sufficient to only pass charge through its thickness, as opposed to laterally. In this aspect, the conformal transport layer in accordance with embodiments can function more as a barrier as opposed to conductor. For example, aluminum dopant concentration with an AZO conformal transport layer 240 may be less than the aluminum dopant concentration with an AZO bottom electrode layer 210. Morphology can also be different compared to an AZO electrode layer. In embodiment, a conformal transport layer 240 in accordance with embodiments containing AZO may be amorphous, while an AZO electrode layer may be crystalline in order to provide long range mobility and less defects. The conformal transport layer 240 in accordance with embodiments may function to pass charge between the electrodes, yet have a sufficient resistivity to not short across a patterned electrode layer. Furthermore, the conformal transport layer 240 may encapsulate the subcell layer (e.g. metal-halide perovskite) to prevent perovskite-metal contact and perovskite decomposition.

Figure 3A:
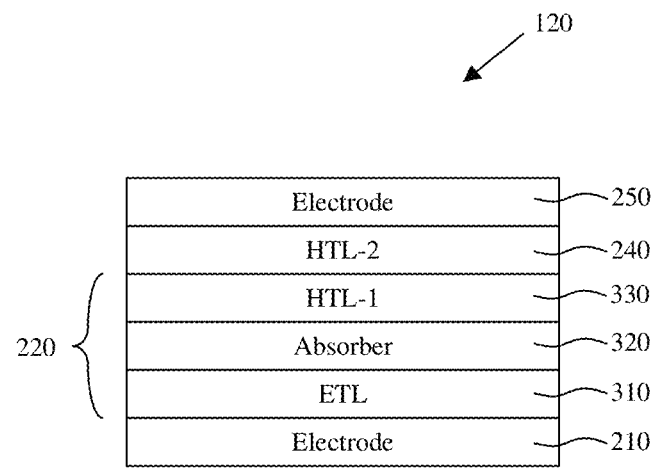
FIG. 3A is an illustrative diagram of solar cell stack-up in accordance with embodiments.

Various exemplary solar cell 120 stack-ups are illustrated in FIGS. 3A-4B. FIG. 3A is an illustrative diagram of single junction solar cell stack-up in accordance with an embodiment. As illustrated, the solar cell 120 may include a bottom electrode layer 210, a top electrode layer 250, and a subcell layer 220 between the bottom and top electrode layers. Additionally, a conformal transport layer 240 may be formed on the subcell layer 220. The subcell layer 200 includes an absorber layer 320 and one or more transport layers. In the embodiment illustrated, the subcell layer 200 includes an electron transport layer (ETL) 310 over the bottom electrode, an absorber layer 320 over the ETL 310, and an optional first hole transport layer (HTL) 330 over the absorber layer 320. The conformal transport layer 240 may also function as an HTL in this configuration, and physically separate the top electrode layer 250 from the subcell layer 220, and specifically from the absorber layer 320. In a specific embodiment, bottom electrode layer 210 is formed of a transparent material such as ITO, ETL 310 is formed of a n-type metal oxide such as titanium oxide, and the absorber layer 320 is a perovskite-based material. In an embodiment, optional HTL 330 is formed of PTAA or spiro-MeOTAD, while the conformal transport layer 240 is formed of a metal oxide such as vanadium oxide or tungsten oxide. In an embodiment, the top electrode layer 250 includes one or more metal layers, such as Ag, Cu, Al, Au, etc.

Figure 3B:
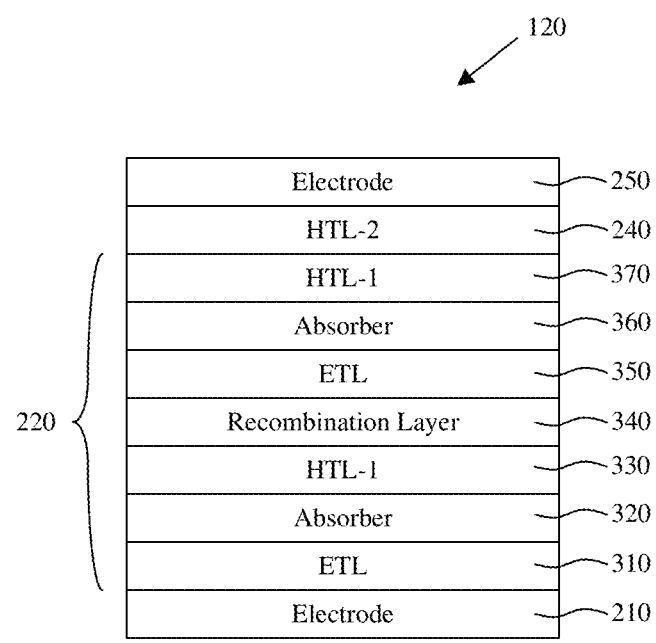
FIG. 3B is an illustrative diagram of tandem solar cell stack-up in accordance with embodiments.

FIG. 3B is an illustrative diagram of tandem solar cell stack-up in accordance with embodiments. The tandem structure may include multiple absorber layers, which may be the same or different materials. In the specific embodiment described the tandem structure is a perovskite-perovskite tandem structure, though embodiments are not so limited. Electrode layer 210, ETL 310, and absorber layer 320, and HTL 330 may be similar as described with regard to FIG. 3A. Similarly, ETL 350 may be similar to ETL 310, absorber layer 360 similar to absorber layers 320, and HTL 370 similar to HTL 330. Notably, while absorber layers 320, 360 may be formed of similar perovskite-based materials, they may be tuned for different bandgaps. A recombination layer 350 may be located between the stacked subcells, between ETL 350 and HTL 330.

Recombination layer 350 may be a transparent conducting layer such as a TCO, or ITO specifically. Conformal transport layer 240 and top electrode layer 250 may additionally be formed similarly as with regard to FIG. 3A.

Figure 4A:
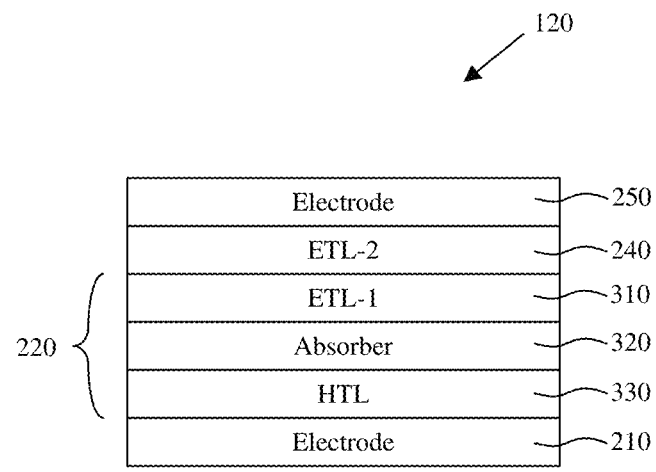
FIG. 4A is an illustrative diagram of solar cell stack-up in accordance with embodiments.
Figure 4B:
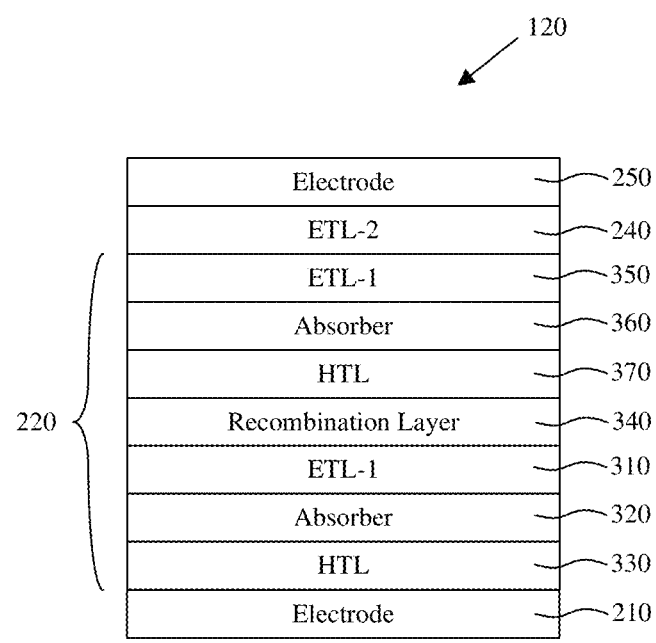
FIG. 4B is an illustrative diagram of tandem solar cell stack-up in accordance with embodiments.

Referring now to FIGS. 4A-4B, FIG. 4A is an illustrative diagram of solar cell stack-up in accordance with an embodiment, and FIG. 4B is an illustrative diagram of tandem solar cell stack-up in accordance with an embodiment. FIGS. 4A-4B are similar to the structures of FIGS. 3A-3B, with the order of electron and hole transport layers being flipped. This change in order of layer formation may additionally change materials selection of layers. In an embodiment, HTL 320 is formed of a metal oxide such as nickel oxide. ETL 310 may be a single layer or multiple layers. In an embodiment of FIG. 4A, ETL 310 is formed of a fullerene, with the conformal transport layer 240 including a transparent metal oxide such a tin oxide or AZO. In an embodiment of FIG. 4B, ETL 310 may include multiple layers, for example a transparent metal oxide such as tin oxide or AZO formed over a fullerene layer. Other layers illustrated may be similar as described with regard to FIGS. 3A-3B.

Figure 5A:
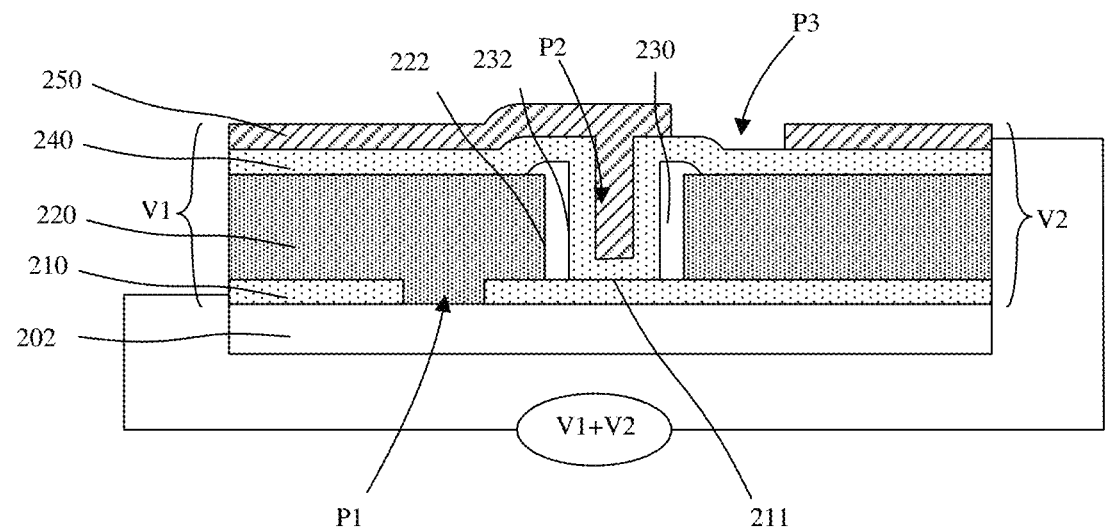
FIG. 5A is a schematic cross-sectional side view illustration of an interconnect with printed non-metallic intermediate layer within a subcell patterned line opening and masked top electrode layer in accordance with an embodiment.
Figure 5B:
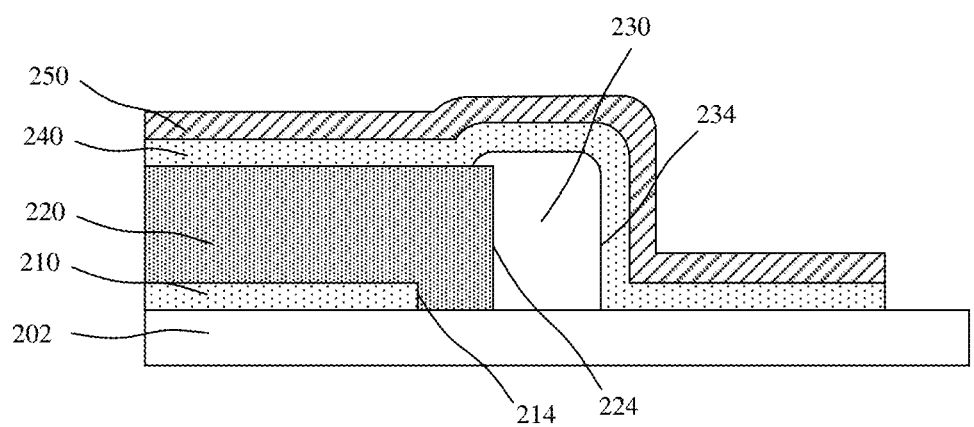
FIG. 5B is a schematic cross-sectional side view illustration of edge encapsulation of a solar cell module including the interconnect of FIG. 3A in accordance with an embodiment.

Referring now to FIG. 5A a schematic cross-sectional side view illustration is provided of an interconnect with printed non-metallic intermediate layer in accordance with an embodiment. Specifically, FIG. 5A illustrates the interconnect between serial cells 120, and additive voltages V1, V2 as shown in FIG. 1. The solar cell interconnect may include a bottom electrode layer 210 on a substrate 202, a first patterned line opening P1 in the bottom electrode layer 210, a subcell layer 220 over the bottom electrode layer 210 and within the first patterned line opening P1, a second patterned line opening P2 in the subcell layer 220, a non-metallic intermediate layer 230 along sidewalls of the second patterned line opening P2, a conformal transport layer 240 over the subcell layer 220, on the non-metallic intermediate layer 230 within the second patterned line opening P2 and over the bottom electrode layer 210 within the second patterned line opening P1, and a top electrode layer 250 over the conformal transport layer 240 and on the conformal transport layer 240 within the second patterned line opening P2. The conformal transport layer 240 illustrated in FIG. 5A may be a continuous layer over and between multiple adjacent cells 110, illustrated by the additive voltages V1 and V2. The conformal transport layer 240 may also be continuous past outside perimeter 224 the subcell layer 220 as shown in FIG. 5B. In the embodiment illustrated, an opening may be formed in the non-metallic intermediate layer that exposes a top surface 211 the bottom electrode layer 210. For example, the non-metallic intermediate layer 230 may be formed of a non-electrically conductive material and the conformal transport layer 240 is in direct contact with the bottom electrode layer 210 in the second patterned line opening P2.

In an embodiment, the top electrode layer 250 includes a metal layer, while the bottom electrode layer 210 is formed of a transparent material. In a particular embodiment, the subcell layer 220 includes a perovskite absorber layer. The subcell layer 220 may be a single cell layer, or include multiple subcells. For example, the subcell layer 220 can include a tandem structure including multiple subcells. The conformal transport layer 240 may function to encapsulate and protect the subcell layer 220, for example from decomposition and metal diffusion. Exemplary materials include oxides (e.g. metal oxides), nitrides (e.g. metal nitrides), polymers, and small molecules. Exemplary metal oxides may be titanium oxide, zinc oxide, tin oxide, nickel oxide, vanadium oxide, tungsten oxide, indium oxide, any of which may be doped. For example, some TCOs may be ITO, AZO, IZO cadmium stannate. Exemplary metal nitrides include at least titanium nitride and tungsten nitride. Some exemplary polymers include poly(triaryl amine) (PTAA) and polyaniline. Some exemplary small molecules include 2,2',7,7'-Tetrakis[N,N-di(4-methoxyphenyl)amino]-9,9'-spirobifluorene (spiro-MeOTAD), and fullerenes. Suitable deposition techniques to form a conformal layer may include chemical vapor deposition (CVD), atomic layer deposition (ALD), solution coating and evaporation. In an embodiment, the conformal transport layer is less than 1,000 nm thick, such as less than 150 nm thick, or more specifically less than 50 nm thick such as 10-40 nm thick. The conformal transport layer may be doped. For example, the conformal transport layer may be AZO. The conformal transport layer may be sufficiently thin to transport charge through its thickness and not be laterally conductive. The conformal transport layer 240 may be characterized by a resistivity greater than 0.1 ohm·cm. The conformal transport layer may prevent metal diffusion, and function as an electron transport layer or hole transport layer for the solar cell 120.

Still referring to FIG. 5A, the solar cell interconnect may include a third patterned line opening P3 in the top electrode layer 250. In the particular embodiment illustrated the third patterned line opening P3 does not completely extend through a thickness of the conformal transport layer 240 so that the conformal transport layer can protect the underlying subcell layer 220.

FIG. 5B is a schematic cross-sectional side view illustration of edge encapsulation of a solar cell module including the interconnect of FIG. 5A in accordance with an embodiment. In the embodiment illustrated, the solar cell module may include a bottom electrode layer 210 including a plurality of first patterned line openings, a subcell layer 220 over the bottom electrode layer 210, the subcell layer including a plurality of second patterned line openings, a conformal transport layer 240 over subcell layer and laterally surrounding an outside perimeter 224 the subcell layer 220, and a patterned top electrode layer 250 over the conformal transport layer 240. In the embodiment illustrated, a non-metallic intermediate layer 230 is located between the conformal transport layer 240 and the subcell layer 220, and the non-metallic intermediate layer 230 laterally surrounds the outside perimeter 224 of the subcell layer 220. Additionally, the conformal transport layer 240 may also surround an outside perimeter 234 of the non-metallic intermediate layer 230.

Several variations of the embodiments illustrated in FIGS. 5A-5B are contemplated. For example, referring to FIG. 6A, the third patterned line opening P3 may partially or completely extend through any of the top electrode layer 250, the conformal transport layer 240, and the subcell layer 220. As shown, a non-electrically conductive material 260 can fill the third patterning line opening P3. For example, the non-electrically conductive material 260 may be a polymer, metal oxide, or nitride material and may function to prevent metal degradation from where the conformal transport layer 240 is interrupted by the third patterned line opening P3. In an embodiment the non-electrically conductive material 260 and the non-metallic intermediate layer 230 are formed of the same material.

Figure 6A:
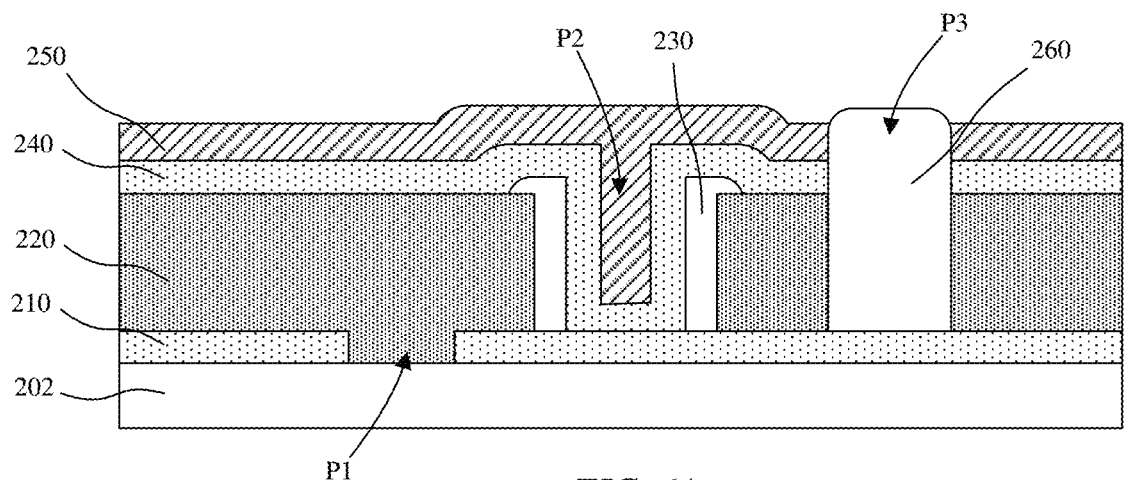
FIG. 6A is a schematic cross-sectional side view illustration of a variation of the interconnect of FIG. 5A with scribed cells in accordance with an embodiment.
Figure 6B:
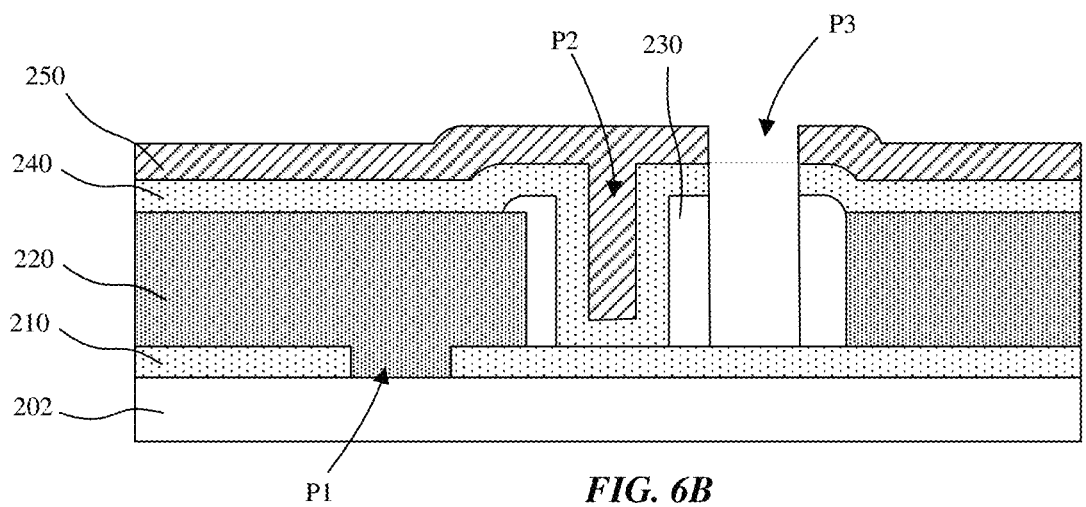
FIGS. 6B-6C are schematic cross-sectional side view illustrations of variations of the interconnect of FIG. 5A with a printed non-metallic intermediate layer within an offset subcell patterned line opening in accordance with an embodiment.
Figure 6C:
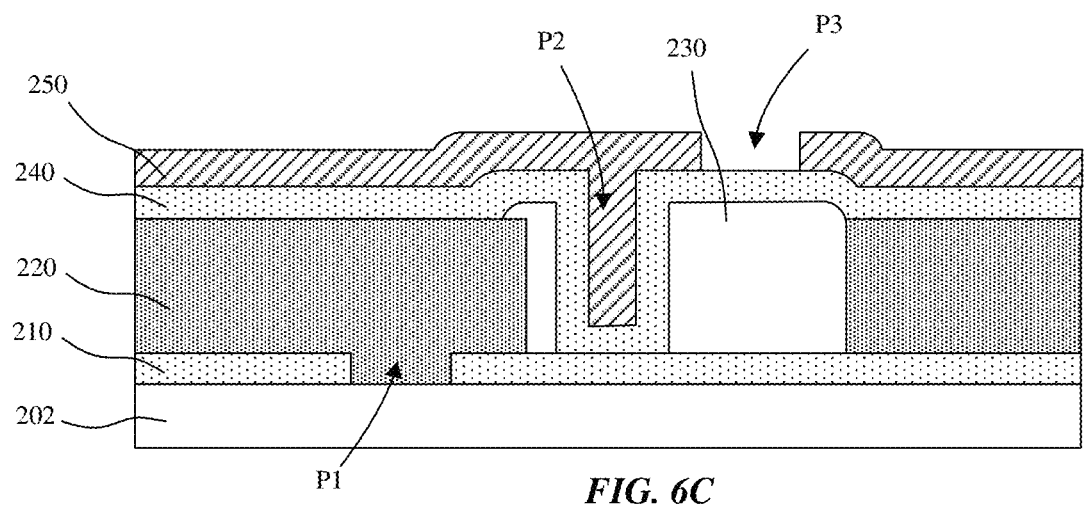

Another alternative is illustrated in FIG. 6B, where rather than forming a separate non-electrically conductive material in the third patterned line opening P3, the non-metallic intermediate layer 230 thickness may be offset within the second patterned line opening P2. In this case, the third patterned line opening P3 extends through a thickness of the non-metallic intermediate layer 230 rather than the subcell layer 220 in order to provide further protection of the subcell layer 220 to third patterned line opening P3. In such an embodiment, it may not be necessary to provide a further insulating material within the third patterned line opening P3. In the embodiments illustrated in FIGS. 6A-6B, the third patterned line opening P3 may extend through the previously continuous conformal transport layer 240. FIGS. 6A-6B illustrate alternatively in which the break is prepared by a non-electrically conductive material 260 or pre-existing non-metallic intermediate layer 230. Alternatively, or additionally, a continuous protective layer may be formed over the entire device stack. FIG. 6C provides an additional alternative to that illustrated in FIG. 6B, in which the non-metallic intermediate layer 230 is underneath the third patterned line opening P3 as a precaution, even though the third patterned line opening P3 does not extend into the non-metallic intermediate layer 230.

Figure 7:
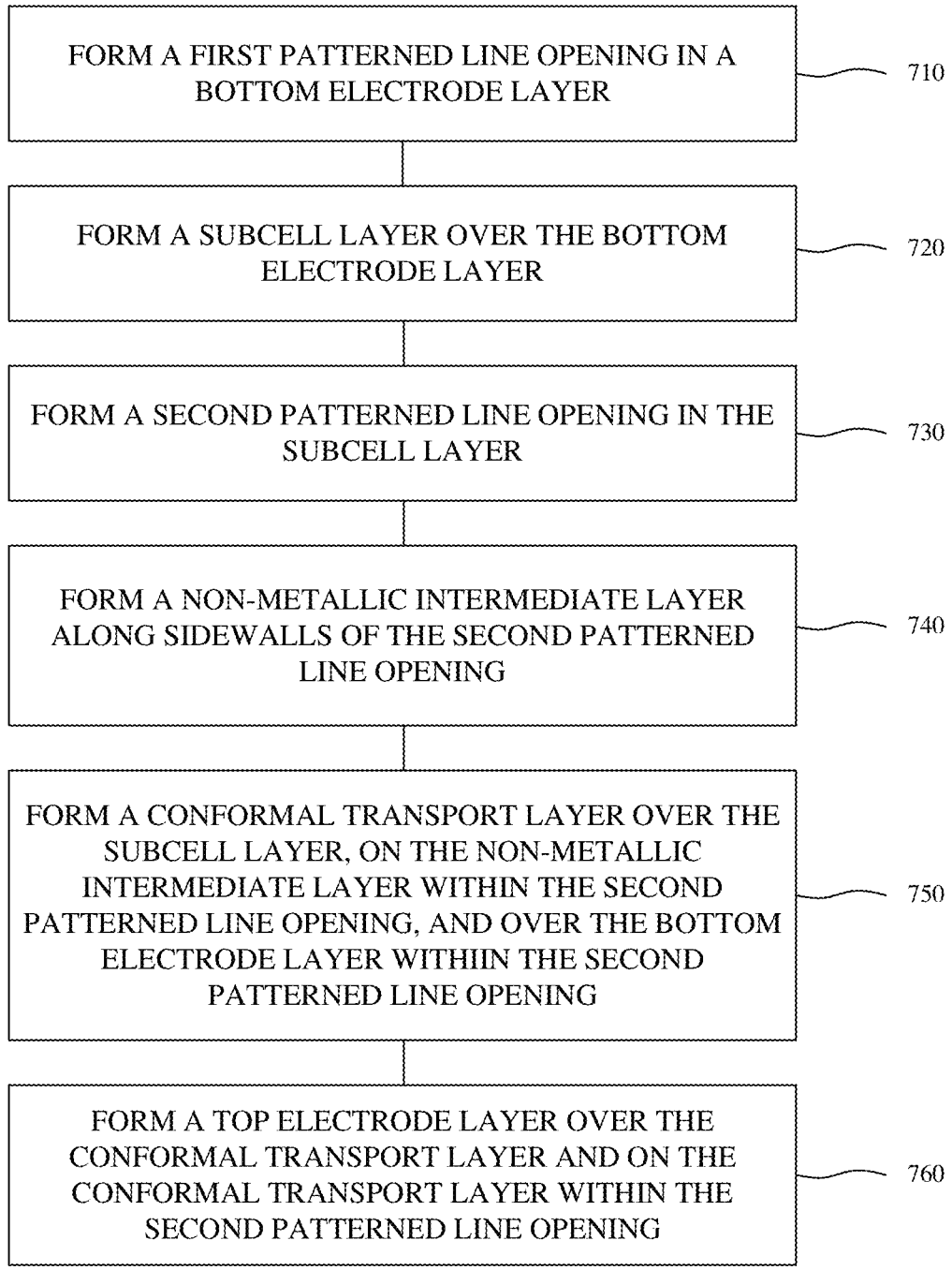
FIG. 7 is flow chart illustrating a method of forming the interconnect of FIG. 5A in accordance with an embodiment.
Figure 8A:
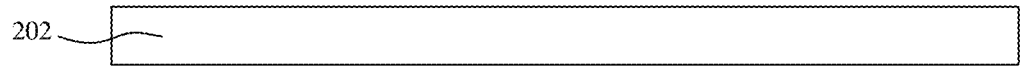
FIGS. 8A-8I are schematic cross-sectional side view illustrations of a method of forming the interconnect of FIG. 5A in accordance with an embodiment.
Figure 8B:
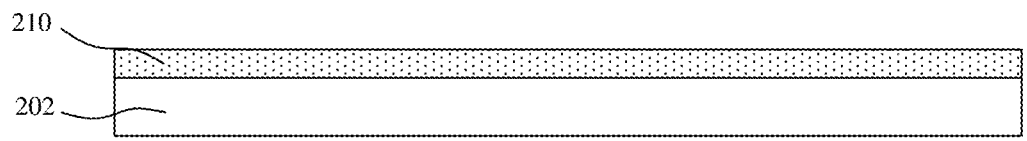
Figure 8C:
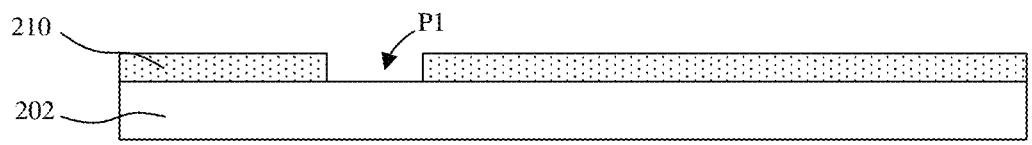
Figure 8D:
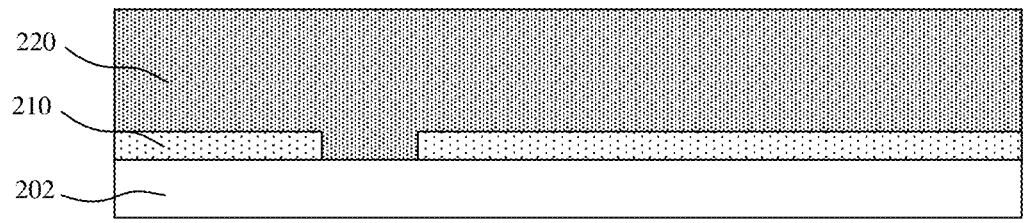
Figure 8E:
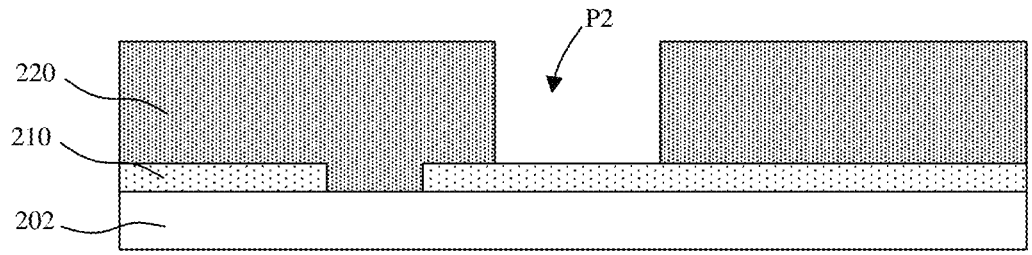
Figure 8F:
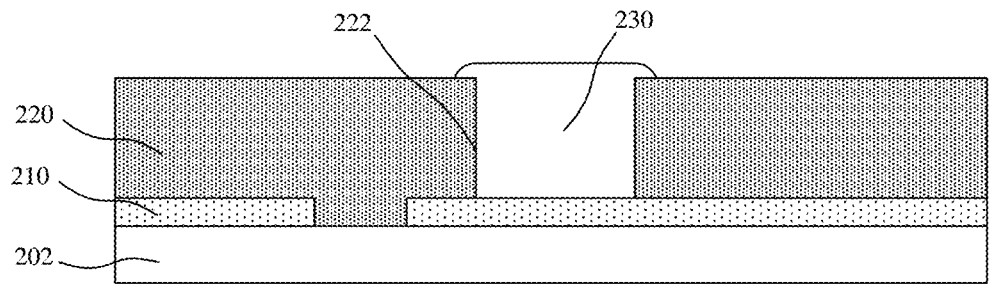
Figure 8G:
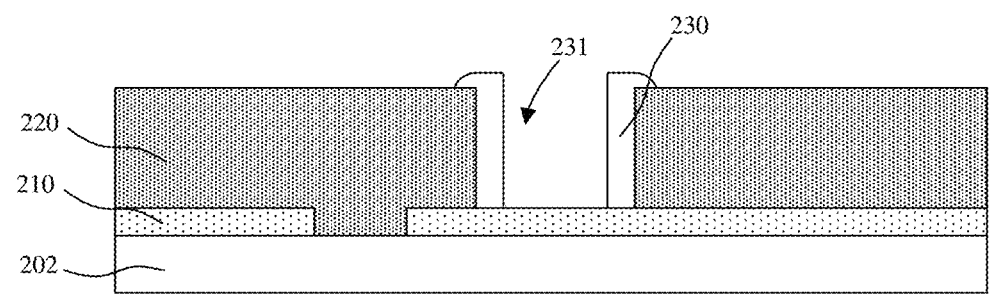
Figure 8H:
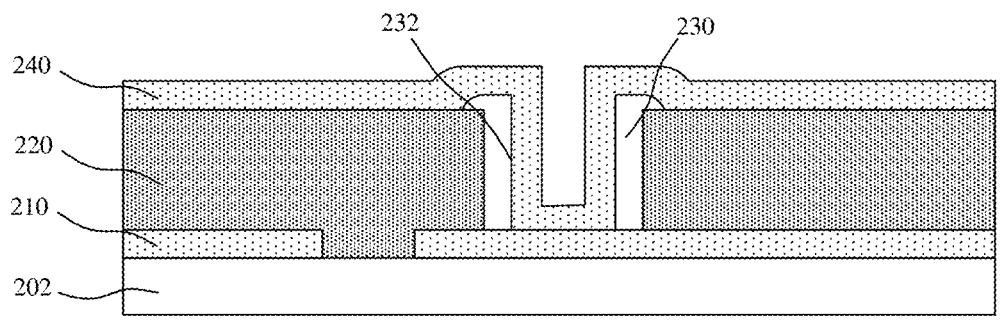
Figure 8I:
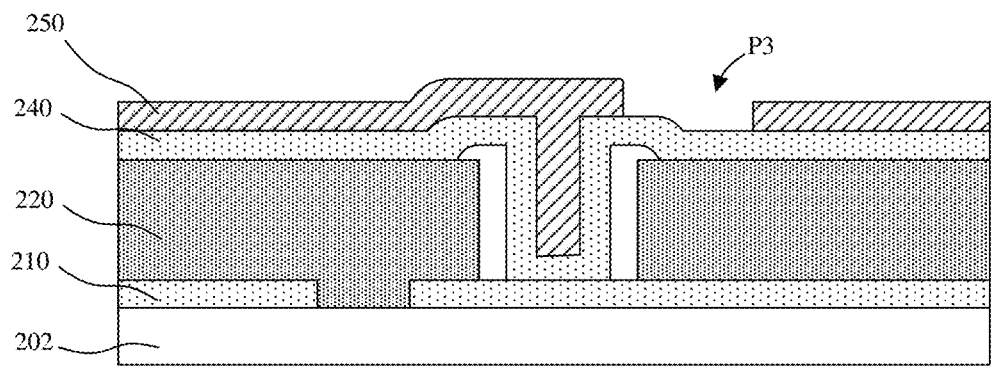

Referring now to FIGS. 7-8I, FIG. 7 is flow chart illustrating a method of forming the interconnect of FIG. 5A in accordance with an embodiment. FIGS. 8A-8I are schematic cross-sectional side view illustrations of a method of forming the interconnect of FIG. 5A in accordance with an embodiment. In the following description, the processing sequence of FIG. 7 is made with regard to the cross-sectional side view illustrations of FIGS. 8A-8I. In interests of conciseness, and to not overly obscure embodiments the processing sequence variations to for the embodiments illustrated in FIGS. 6A-6C are not separately illustrated, and instead are described together along with FIGS. 7-8I. Additionally, it is understood that certain embodiments may be practiced without one or more of these specific details, or in combination with other known methods and configurations described herein.

As shown in FIG. 8A the processing sequence may begin with a substrate 202. Substrate 202 may be a single or multiple layer substrate, including one or more layers of glass, plastic, or conductive metal foil. The bottom electrode layer 210 may then be formed on substrate 202 as illustrated in FIG. 8B. Bottom electrode layer 210 may be formed of materials such as cadmium stannate, TCOs, including ITO, FTO, IZO, etc. Referring now to FIG. 8C, at operation 710 a first patterned line opening P1 is then formed in the bottom electrode layer 210. Various patterning techniques such as mechanical or laser scribing, chemical etching, or deposition with a shadow mask can be used to form P1. In an embodiment, mechanical or laser scribing is utilized in a roll-to-roll manufacturing process.

The subcell layer 220 is then formed over the patterned bottom electrode layer 210 at operation 720, as shown in FIG. 8D. The subcell layer 220 generally includes a subcell including an absorber layer and one or more transport layers. In an embodiment, the subcell layer includes an absorber layer between a hole transport layer and an electron transport layer. The subcell layer 220 may include a single subcell, or multiple subcells such as with a tandem structure. In accordance with embodiments, the subcell layer 220 includes one or more absorber layers including a perovskite material. In an embodiment, the subcell layer 220 includes a tandem structure including a perovskite material in one or both of the subcells. For example, a tandem perovskite cell structure may include two subcells with perovskite absorber layers with different bandgaps. Perovskite materials may be characterized by the formula $ABX_3$, with A representing a large atomic or molecular cation (e.g. Cs, methylammonium, formamidinium, etc.), with B representing a positively charged cation (e.g. metal, lead, plumbate, Sn), and X representing a negatively charged anion (e.g. halide, I, Br, Cl).

The subcell layer 220 is then patterned to form a second patterned line opening P2 at operation 730, as illustrated in FIG. 8E. Various patterning techniques such as mechanical or laser scribing, chemical etching, or deposition with a shadow mask can be used to form P2. In an embodiment, mechanical or laser scribing is utilized due to chemical stability of the perovskite absorber layer(s). Referring now to FIGS. 8F-G, at operation 740 a non-metallic intermediate layer 230 is formed along sidewalls 222 of P2. In the specific embodiment illustrated, the non-metallic intermediate layer 230 is first applied to fill P2 using a printing technique such as ink jet, extrusion, spraying, etc. The non-metallic intermediate layer 230 is formed of a non-metallic material that does not react with the absorber layer(s). In an embodiment, the non-metallic intermediate layer includes an insulator material. In an embodiment, the non-metallic intermediate layer includes a polymer such as, but are not limited to, poly(methyl methacrylate) (PMMA) and poly(vinyl alcohol) (PVA). As shown in FIG. 8G, the non-metallic intermediate layer 230 is patterned to form an opening 231 that may expose the bottom electrode layer 210. For example, this patterning may utilize a mechanical or laser scribing.

In the particular embodiment illustrated in FIG. 8G, opening 231 substantially aligns with the middle of P2 such that lateral thicknesses of the non-metallic intermediate layer 230 on opposite sidewalls 222 are substantially the same. However, embodiments are not so limited. For example, in a processing sequence to create the interconnect structure of FIG. 6B or FIG. 6C, the opening 231 and P2 may be offset, with different lateral thicknesses of the non-metallic intermediate layer 230 on opposite sidewalls 222.

Referring now to FIG. 8H, at operation 750 a conformal transport layer 240 is formed over the subcell layer 220, on the non-metallic intermediate layer within P2, and over the bottom electrode layer within P2. The conformal transport layer 240 may be continuous. The conformal transport layer 240 may function to encapsulate and protect the subcell layer 220, for example from decomposition and metal diffusion. Exemplary materials include oxides (e.g. metal oxides), nitrides (e.g. metal nitrides), polymers, and small molecules. Exemplary metal oxides may be titanium oxide, zinc oxide, tin oxide, nickel oxide, vanadium oxide, tungsten oxide, indium oxide, any of which may be doped. For example, some TCOs may be ITO, AZO, IZO cadmium stannate. Exemplary metal nitrides include at least titanium nitride and tungsten nitride. Some exemplary polymers include poly(triaryl amine) (PTAA) and polyaniline. Some exemplary small molecules include 2,2',7,7'-Tetrakis[N,N-di(4-methoxyphenyl)amino]-9,9'-spirobifluorene (spiro-MeOTAD), and fullerenes. Suitable deposition techniques to form a conformal layer may include chemical vapor deposition (CVD), atomic layer deposition (ALD), solution coating and evaporation. In an embodiment, the conformal transport layer is less than 1,000 nm thick, such as less than 150 nm thick, or more specifically less than 50 nm thick such as 10-40 nm thick. The conformal transport layer may be doped. For example, the transport layer may be AZO. The conformal transport layer may be sufficiently thin to transport charge through its thickness, and not be laterally conductive. The conformal transport layer 240 may be characterized by a resistivity greater than 0.1 ohm·cm. In an embodiment, the conformal transport layer also functions as an electron transport layer for the solar cell 120. Alternatively, the conformal transport layer may function as a hole transport layer for the solar cell 120.

In an embodiment, an AZO containing conformal transport layer 240 is formed using ALD or low temperature CVD to form an amorphous layer. The low temperature deposition process may not provide necessary conditions for crystal growth. This may be in contrast to a high temperature process (e.g. high temperature sputter and anneal) used for the formation of a crystalline AZO layer for use as an electrode layer.

The top electrode layer 250 may then be formed over the conformal transport layer and on the conformal transport layer within P2 at operation 760 as illustrated in FIG. 8I. In a particular embodiment, the top electrode layer 250 is deposited through a shadow mask to form the third patterned line opening P3 during deposition. This may protect underlying layers from solution processing operation. Suitable deposition technique may include evaporation, sputter, printing, and spraying. In an embodiment, the top electrode layer 250 includes one or more metal layers, such as Ag, Cu, Al, Au, etc.

In an embodiment scribing is utilized to form P3 in the top electrode layer 250. In the embodiments illustrated in FIGS. 6B-6C, the non-metallic intermediate layer 230 is located underneath P3, or P3 extends into or completely through the non-metallic intermediate layer 230. Either configuration may provide protection for the absorber layer(s). In the embodiment illustrated in FIG. 6A, scribing can be used to form P3 partially or completely through any of the top electrode layer 250, conformal transport layer 240, and subcell layer 220. In such an embodiment, P3 is partially or fully filled with an insulating material 260 to provide protection for the absorber layer(s).

In the foregoing description, specific processing techniques and materials selections have been provided. It is to be appreciated that that the specific processing techniques and materials selections may also be applied to the following embodiments described with regard to FIGS. 9A-26C. Accordingly, in interest of conciseness, detailed discussion of specific processing techniques and materials selections may not be repeated.

Figure 9A:
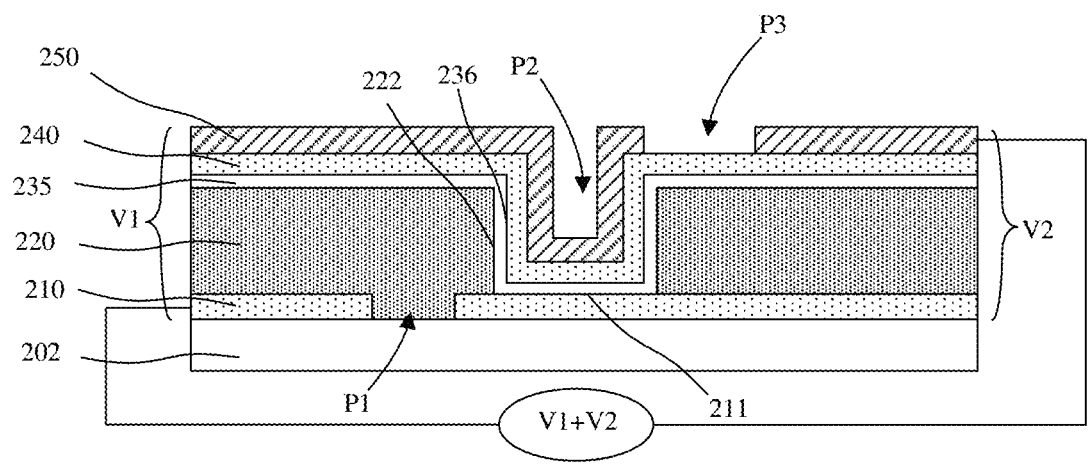
FIG. 9A is a schematic cross-sectional side view illustration of an interconnect with a transport layer within a subcell patterned line opening in accordance with an embodiment.

FIG. 9A is a schematic cross-sectional side view illustration of an interconnect with a conformal transport layer within a subcell patterned line opening in accordance with an embodiment. As shown, the solar cell interconnect may include a bottom electrode layer 210 on a substrate 202, a first patterned line opening P1 in the bottom electrode layer 210, a subcell layer 220 over the bottom electrode layer 210 and within the first patterned line opening P1, a second patterned line opening P2 in the subcell layer 220, a non-metallic intermediate layer 235 along sidewalls of the second patterned line opening P2, a conformal transport layer 240 over the subcell layer 220, on the non-metallic intermediate layer 235 within the second patterned line opening P2 and over the bottom electrode layer 210 within the second patterned line opening P1, and a top electrode layer 250 over the conformal transport layer 240 and on the conformal transport layer 240 within the second patterned line opening P2. The conformal transport layer 240 may be continuous. In the embodiment illustrated, the non-metallic intermediate layer 235 is a thin insulator layer or nucleation layer that is globally formed. In an embodiment, non-metallic intermediate layer 235 is less than 10 nm thick, such as 1-5 nm thick. As shown, the non-metallic intermediate layer 235 may physically separate the conformal transport layer 240 from bottom electrode layer 210. In accordance with embodiment, the non-metallic intermediate layer 235 is formed of a material selected from the group consisting of an insulator, semiconductor, and carbon. The non-metallic intermediate layer 235 may be sufficiently thin to allow the transport of charge. Additionally, conformality of the non-metallic intermediate layer may facilitate uniform and dense growth of a subsequent conformal transport layer 240. In an embodiment, the non-metallic intermediate layer 235 includes OH groups to help nucleate the growth of a metal oxide containing conformal transport layer 240. Ethoxylated polyethyleneimine (PETE) and polyvinyl alcohol (PVA) have such OH groups. The non-metallic intermediate layer 235 may also be formed of materials such as polyvinyl phenol and polystyrene. In an alternative embodiment, the non-metallic intermediate layer 235 may be patterned to expose the bottom electrode layer 210 similarly as non-metallic intermediate layer 230 previously described.

Figure 9B:
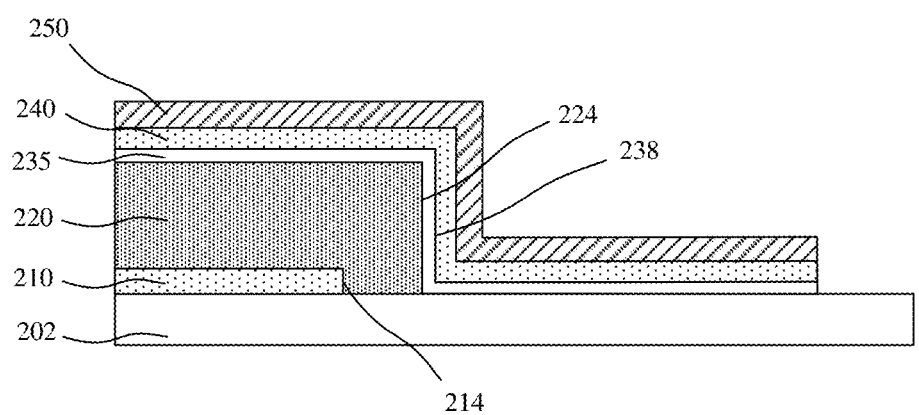
FIG. 9B is a schematic cross-sectional side view illustration of edge encapsulation of a solar cell module including the interconnect of FIG. 9A in accordance with an embodiment.

FIG. 9B is a schematic cross-sectional side view illustration of edge encapsulation of a solar cell module including the interconnect of FIG. 9A in accordance with an embodiment. In the embodiment illustrated, the solar cell module may include a bottom electrode layer 210 including a plurality of first patterned line openings, a subcell layer 220 over the bottom electrode layer 210, the subcell layer including a plurality of second patterned line openings, a conformal transport layer 240 over subcell layer and laterally surrounding an outside perimeter 224 the subcell layer 220, and a patterned top electrode layer 250 over the conformal transport layer 240. In the embodiment illustrated, a non-metallic intermediate layer 235 is located between the conformal transport layer 240 and the subcell layer 220, and the non-metallic intermediate layer 235 laterally surrounds the outside perimeter 224 of the subcell layer 220. Additionally, the conformal transport layer 240 may also surround an outside perimeter 238 of the non-metallic intermediate layer 235.

Figure 10:
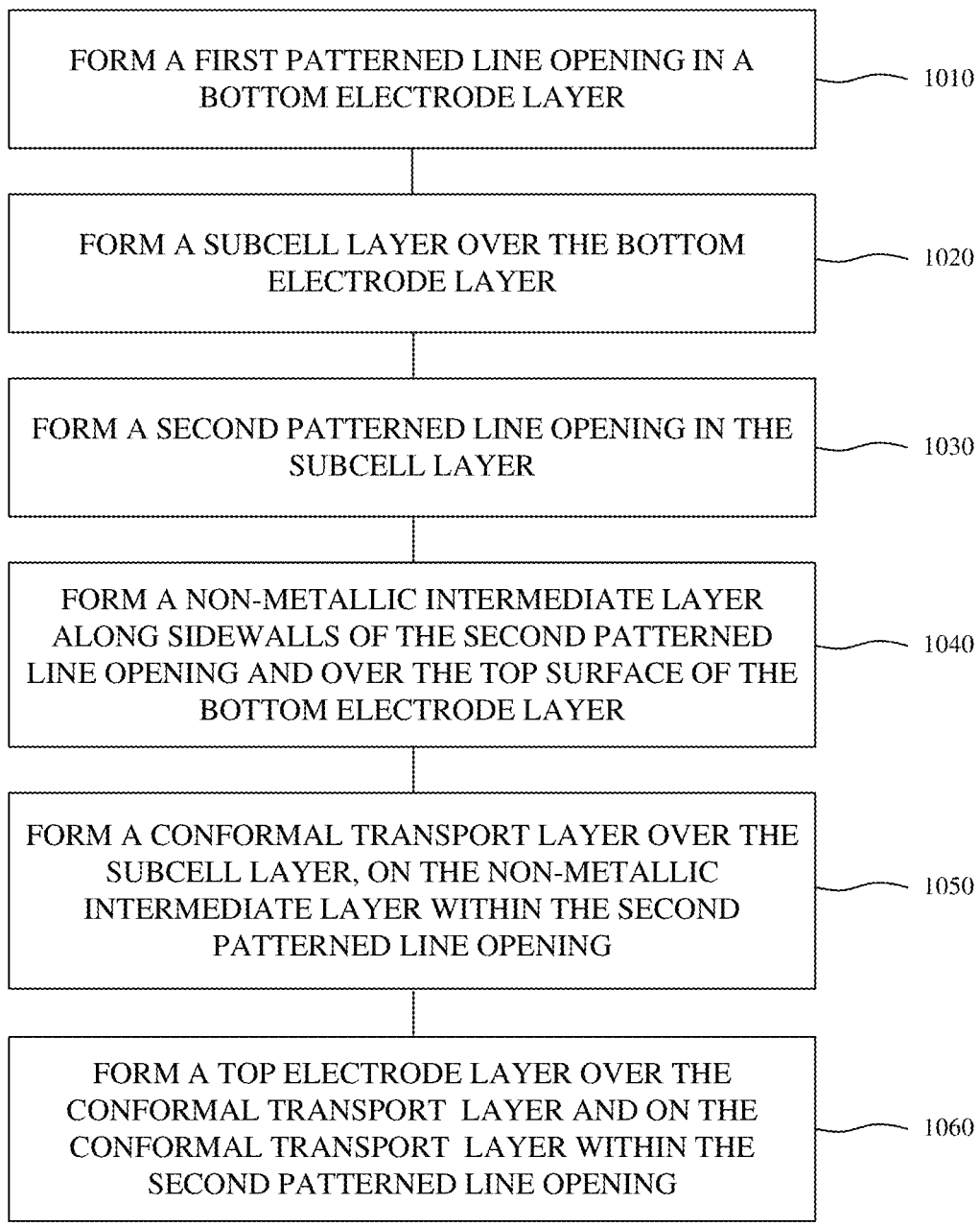
FIG. 10 is flow chart illustrating a method of forming the interconnect of FIG. 9A in accordance with an embodiment.
Figure 11A:
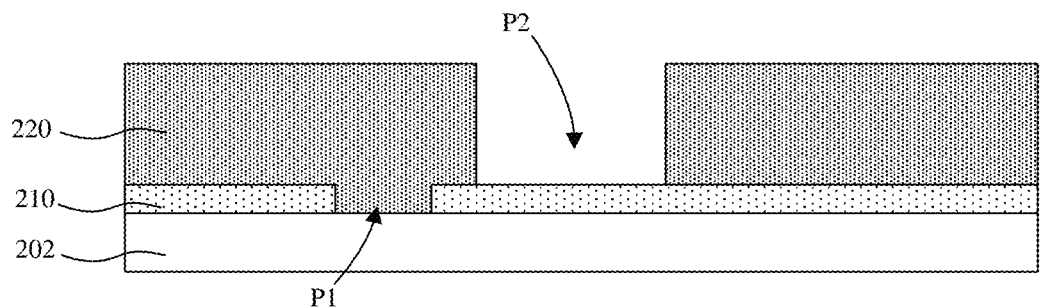
FIGS. 11A-11D are schematic cross-sectional side view illustrations of a method of forming the interconnect of FIG. 9A in accordance with an embodiment.
Figure 11B:
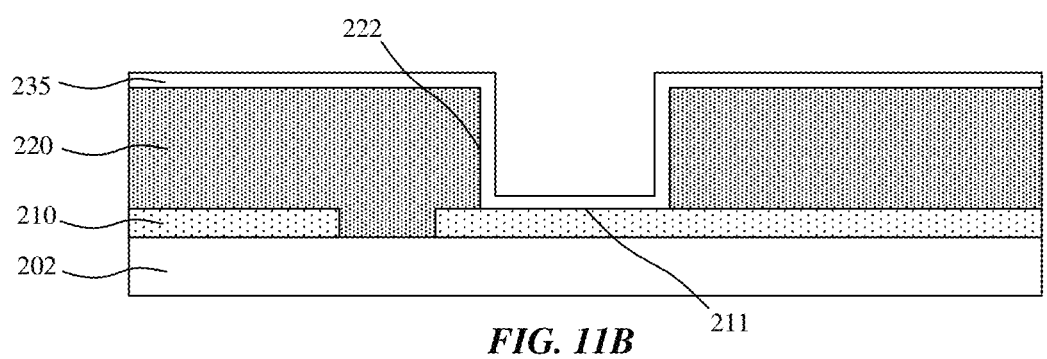
Figure 11C:
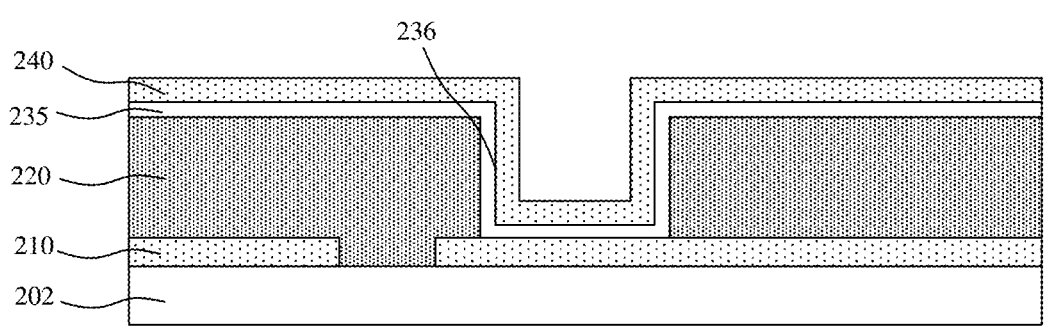
Figure 11D:
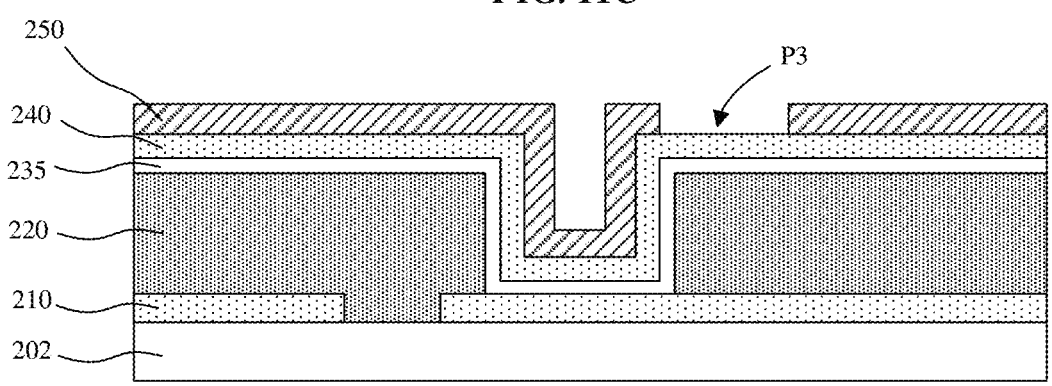

Referring now to FIGS. 10-11D, FIG. 10 is flow chart illustrating a method of forming the interconnect of FIG. 9A in accordance with an embodiment. FIGS. 11A-11D are schematic cross-sectional side view illustrations of a method of forming the interconnect of FIG. 9A in accordance with an embodiment. In the following description, the processing sequence of FIG. 10 is made with regard to the cross-sectional side view illustrations of FIGS. 11A-11D. Additionally, it is understood that certain embodiments may be practiced without one or more of these specific details, or in combination with other known methods and configurations described herein.

The processing sequence may begin similarly as with that of FIG. 7. At operation 1010 a first patterned line opening P1 is formed in the bottom electrode layer 210. At operation 1020 the subcell layer 220 is formed over the patterned bottom electrode layer 210. Referring to FIG. 11A the subcell layer 220 is then patterned to form a second patterned line opening P2 at operation 730. Referring to FIG. 11B, at operation 1040 a non-metallic intermediate layer 235 is formed along sidewalls 222 of P2 and over the top surface of the bottom electrode layer 210. The non-metallic intermediate layer 235 may be formed directly on the top surface 211 of the bottom electrode layer 210. Alternatively, the non-metallic intermediate layer 235 may be patterned similarly as non-metallic intermediate layer 230 to expose the bottom electrode layer 210. In accordance with embodiments, non-metallic intermediate layer 235 may be a nucleation layer or insulator layer less than 10 nm thick. At such a thickness, the thin non-metallic intermediate layer may be thin enough to allow the passage of charge through either conduction or tunneling. Thus, the non-metallic intermediate layer 235 may be a conformal layer, with thickness less than 10 nm along sidewalls 222 of P2, and on the top surface 211 of the bottom electrode layer 210. The non-metallic intermediate layer may be deposited using a suitable printing technique such as spraying, evaporation and vapor transport deposition. If the non-metallic intermediate layer 235 is formed of an insulator or organic material, it may aid in the nucleation or adhesion of the subsequently formed conformal transport layer. The non-metallic intermediate layer 235 may be formed of a non-metallic material that does not react with the absorber layer(s), such as an insulator, semiconductor, and carbon. In the embodiment illustration, the non-metallic intermediate layer 235 is a conformal layer in order to cover the entire surface and aid in nucleation.

Referring now to FIG. 11C, at operation 1050 a conformal transport layer 240 is formed over the subcell layer 220, on the non-metallic intermediate layer within P2. The conformal transport layer 240 may function to encapsulate and protect the subcell layer 220, for example from decomposition and metal diffusion. Suitable deposition techniques to form a conformal layer may include chemical vapor deposition (CVD), atomic layer deposition (ALD), solution coating and evaporation. In an embodiment, the conformal transport layer is less than 1,000 nm thick, such as less than 150 nm thick, or more specifically less than 50 nm thick such as 10-40 nm thick. The conformal transport layer may be doped. For example, the transport layer may be AZO. The conformal transport layer may be sufficiently thin to transport charge through its thickness, and not be laterally conductive. The conformal transport layer 240 may be characterized by a resistivity greater than 0.1 ohm·cm. In an embodiment, the conformal transport layer also functions as an electron transport layer or hole transport layer for a solar cell 120.

The top electrode layer 250 may then be formed over the conformal transport layer and on the conformal transport layer within P2 at operation 1060 as illustrated in FIG. 11D. In a particular embodiment, the top electrode layer 250 is deposited through a shadow mask to form the third patterned line opening P3 during deposition. This may protect underlying layers from solution processing operation. Suitable deposition technique may include evaporation, sputter, printing, and spraying. In an embodiment, the top electrode layer 250 includes one or more metal layers, such as Ag, Cu, Al, Au, etc. While not separately illustrated, in an alternative embodiment scribing could be performed to create P3 similarly as described and illustrated with regard to FIG. 6A, followed by at least partially filling with a non-electrically conductive material 260.

Figure 12A:
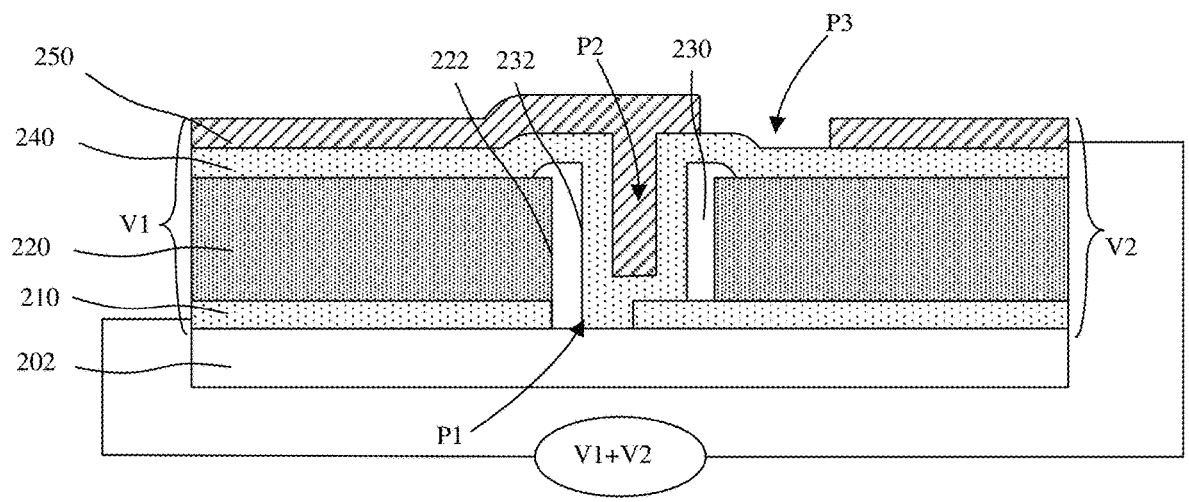
FIG. 12A is a schematic cross-sectional side view illustration of an interconnect with overlapping bottom electrode and subcell patterned line openings in accordance with an embodiment.

FIG. 12A is a schematic cross-sectional side view illustration of an interconnect with overlapping bottom electrode and subcell patterned line openings in accordance with an embodiment. As shown, a solar cell interconnect may include a bottom electrode layer 210 on a substrate 202, a first patterned line opening P1 in the bottom electrode layer 210, a subcell layer 220 over the bottom electrode layer 210 and within the first patterned line opening P1, a second patterned line opening P2 in the subcell layer 220, a non-metallic intermediate layer 235 along sidewalls of the second patterned line opening P2, a conformal transport layer 240 over the subcell layer 220, on the non-metallic intermediate layer 235 within the second patterned line opening P2 and over the bottom electrode layer 210 within the second patterned line opening P1, and a top electrode layer 250 over the conformal transport layer 240 and on the conformal transport layer 240 within the second patterned line opening P2. The conformal transport layer 240 may be continuous. In the embodiment illustrated, P2 overlaps P1. Also shown, are the non-metallic intermediate layer 230 formed along one sidewall 222 of P2 and on the substrate 202 inside of P1, and the non-metallic intermediate layer 230 formed along the opposite sidewall 222 of P2 and on the bottom electrode layer 210. An opening in the non-metallic intermediate layer 230 exposes a top surface the bottom electrode layer. The conformal transport layer 240 of the embodiment illustrated in FIG. 12A may be in direct contact with the bottom electrode layer 210.

Figure 12B:
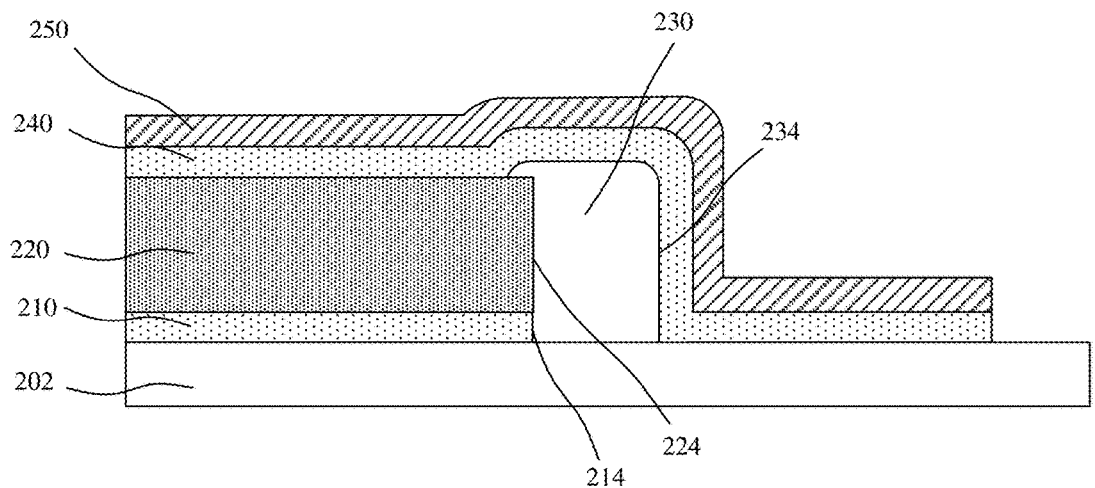
FIG. 12B is a schematic cross-sectional side view illustration of edge encapsulation of a solar cell module including the interconnect of FIG. 12A in accordance with an embodiment.
Figure 13:
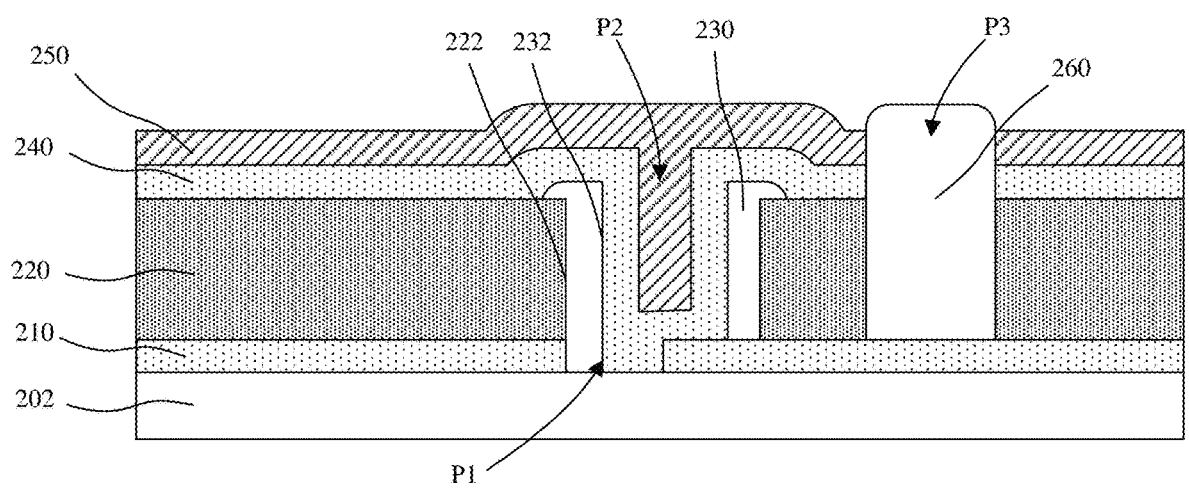
FIG. 13 a schematic cross-sectional side view illustration of a variation of the interconnect of FIG. 12A with a scribed cell in accordance with an embodiment.

FIG. 12B is a schematic cross-sectional side view illustration of edge encapsulation of a solar cell module including the interconnect of FIG. 12A in accordance with an embodiment. Similar to the embodiment illustrated in FIG. 5B, the solar cell module may include a bottom electrode layer 210 including a plurality of first patterned line openings, a subcell layer 220 over the bottom electrode layer 210, the subcell layer including a plurality of second patterned line openings, a conformal transport layer 240 over subcell layer and laterally surrounding an outside perimeter 224 the subcell layer 220, and a patterned top electrode layer 250 over the conformal transport layer 240. In the embodiment illustrated, a non-metallic intermediate layer 230 is located between the conformal transport layer 240 and the subcell layer 220, and the non-metallic intermediate layer 230 laterally surrounds the outside perimeter 224 of the subcell layer 220. Additionally, the conformal transport layer 240 may also surround an outside perimeter 234 of the non-metallic intermediate layer 230.

Several variations of the embodiments illustrated in FIGS. 12A-12B are contemplated. For example, referring to FIG. 13, the third patterned line opening P3 may partially or completely extend through any of the top electrode layer 250, the conformal transport layer 240, and the subcell layer 220. As shown, a non-electrically conductive material 260 can fill the third patterning line opening P3. For example, the non-electrically conductive material 260 may be a polymer, metal oxide, or nitride material and may function to prevent metal degradation from where the conformal transport layer 240 is interrupted by the third patterned line opening P3. In an embodiment the non-electrically conductive material 260 and the non-metallic intermediate layer 230 are formed of the same material.

Figure 14:
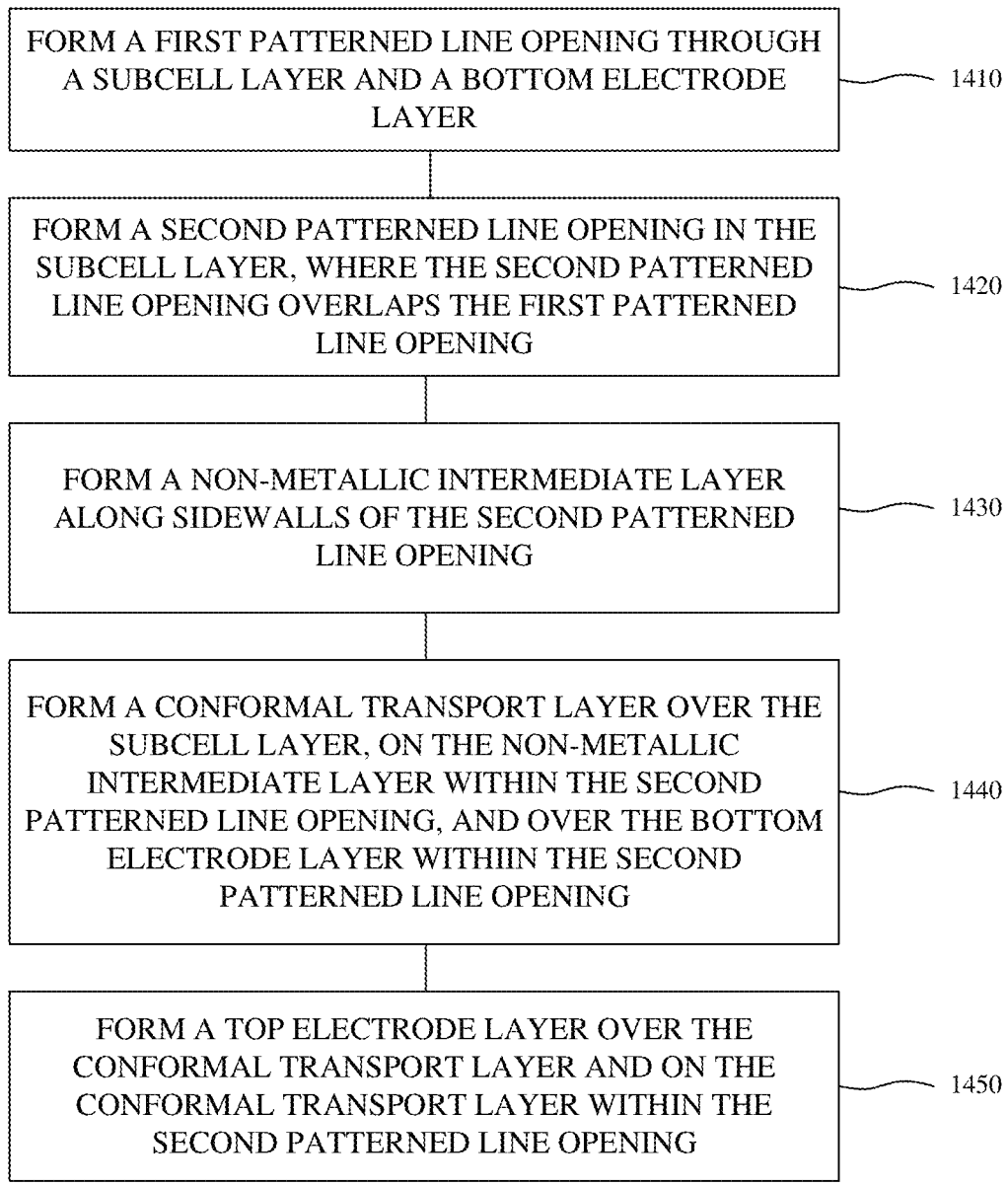
FIG. 14 is flow chart illustrating a method of forming the interconnect of FIG. 12A in accordance with an embodiment.
Figure 15A:
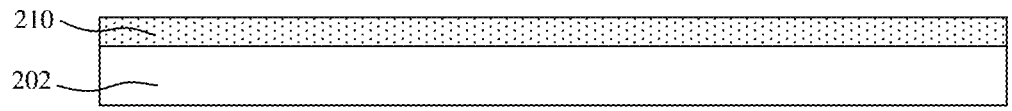
FIGS. 15A-15H are schematic cross-sectional side view illustrations of a method of forming the interconnect of FIG. 12A in accordance with an embodiment.
Figure 15B:
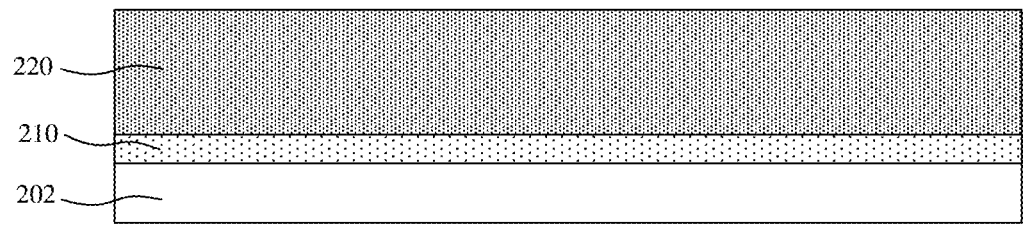
Figure 15C:
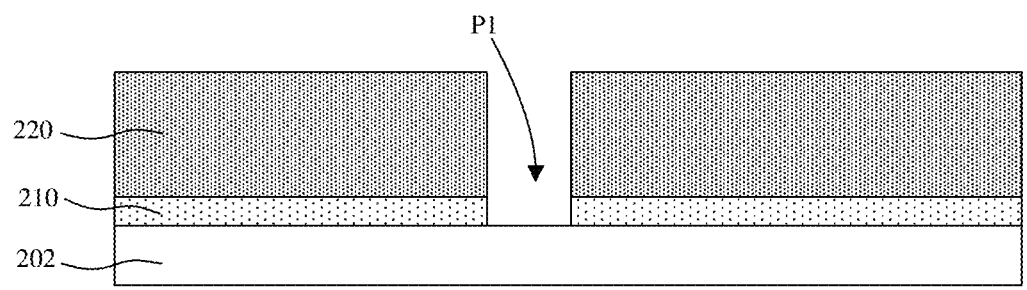
Figure 15D:
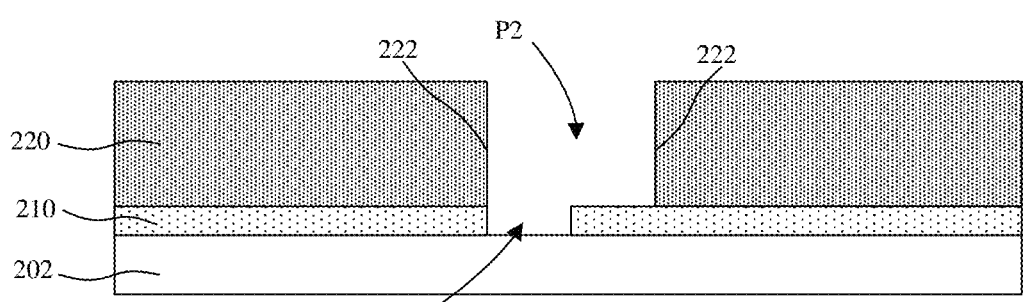
Figure 15E:
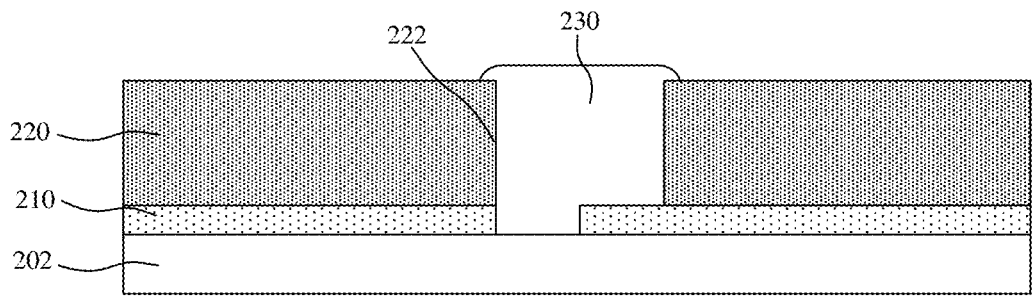
Figure 15F:
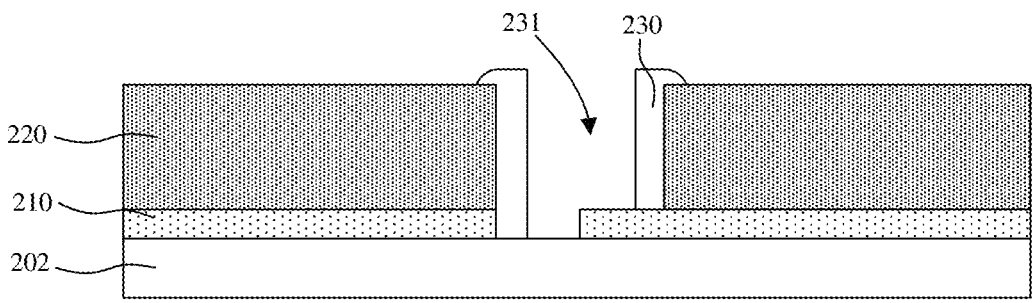
Figure 15G:
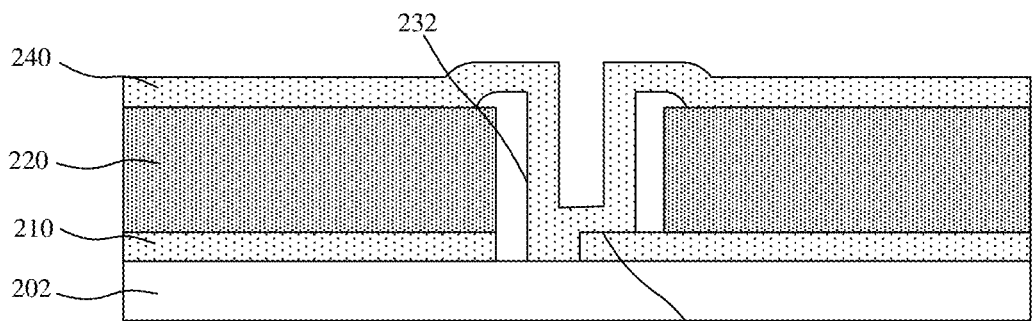
Figure 15H:
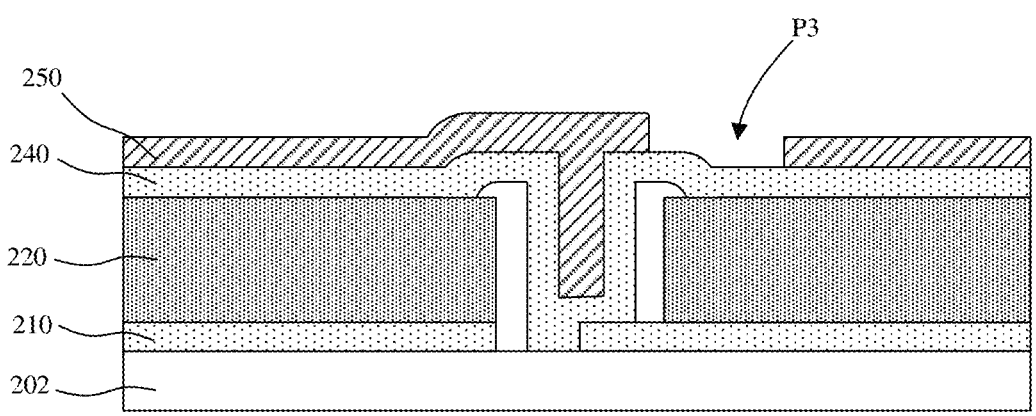

Referring now to FIGS. 14-15H, FIG. 14 is flow chart illustrating a method of forming the interconnect of FIG. 12A in accordance with an embodiment. FIGS. 15A-15H are schematic cross-sectional side view illustrations of a method of forming the interconnect of FIG. 12A in accordance with an embodiment. In the following description, the processing sequence of FIG. 14 is made with regard to the cross-sectional side view illustrations of FIGS. 15A-15H. Additionally, it is understood that certain embodiments may be practiced without one or more of these specific details, or in combination with other known methods and configurations described herein.

Referring to FIG. 15A a bottom electrode layer 210 may first be formed on a substrate 202, followed by the formation of subcell layer 220 as illustrated in FIG. 15B. At operation 1410, a first patterned line opening P1 is formed through the subcell layer 220, and bottom electrode layer 210. At operation 1420 a second patterned line opening P2 is formed in the subcell layer 220, where P2 overlaps P1. P2 may be wider than P1. Additionally, P2 and P1 may share a same sidewall 222 in the subcell layer 220.

Referring now to FIGS. 15E-15F, at operation 1430 a non-metallic intermediate layer 230 is formed along sidewalls 222 of P2. In the specific embodiment illustrated, the non-metallic intermediate layer 230 is first applied to fill P2 using a printing technique such as ink jet, extrusion, spraying, etc. The non-metallic intermediate layer 230 is formed of a non-metallic material that does not react with the absorber layer(s), such as a polymer, carbon or carbon/polymer blend. In an embodiment, the non-metallic intermediate layer is an insulating material. As shown in FIG. 15F, the non-metallic intermediate layer 230 is patterned to form an opening 231 that may expose the bottom electrode layer 210 and optionally substrate 202. For example, this patterning may utilize laser scribing. In the particular embodiment illustrated in FIG. 15F, opening 231 substantially aligns with the middle of P2 such that lateral thicknesses of the non-metallic intermediate layer 230 on opposite sidewalls 222 are substantially the same. However, embodiments are not so limited.

Referring now to FIG. 15G, at operation 1440 a conformal transport layer 240 is formed over the subcell layer 220, and on the non-metallic intermediate layer 230 within P2. In an embodiment, the conformal transport layer 240 is formed on the top surface of the bottom electrode 210. The conformal transport layer 240 may also be formed within P1. The conformal transport layer 240 may function to encapsulate and protect the subcell layer 220, for example from decomposition and metal diffusion. Suitable deposition techniques to form a conformal layer may include chemical vapor deposition (CVD), atomic layer deposition (ALD), solution coating and evaporation. In an embodiment, the conformal transport layer is less than 1,000 nm thick, such as less than 150 nm thick, or more specifically less than 50 nm thick such as 10-40 nm thick. The conformal transport layer may be doped. For example, the transport layer may be AZO. The conformal transport layer may be sufficiently thin to transport charge through its thickness, and not be laterally conductive. The conformal transport layer 240 may be characterized by a resistivity greater than 0.1 ohm·cm. In an embodiment, the conformal transport layer also functions as an electron transport layer or hole transport layer for a solar cell 120.

The top electrode layer 250 may then be formed over the conformal transport layer and on the conformal transport layer within P2 at operation 1450 as illustrated in FIG. 15H. In a particular embodiment, the top electrode layer 250 is deposited through a shadow mask to form the third patterned line opening P3 during deposition. This may protect underlying layers from solution processing operation. Suitable deposition technique may include evaporation, sputter, printing, and spraying. In an embodiment, the top electrode layer 250 includes one or more metal layers, such as Ag, Cu, Al, Au, etc. In the alternative embodiment illustrated in FIG. 13, scribing could be performed to create P3 similarly as described and illustrated with regard to FIG. 6A, followed by at least partially filling with a non-electrically conductive material 260.

Figure 16A:
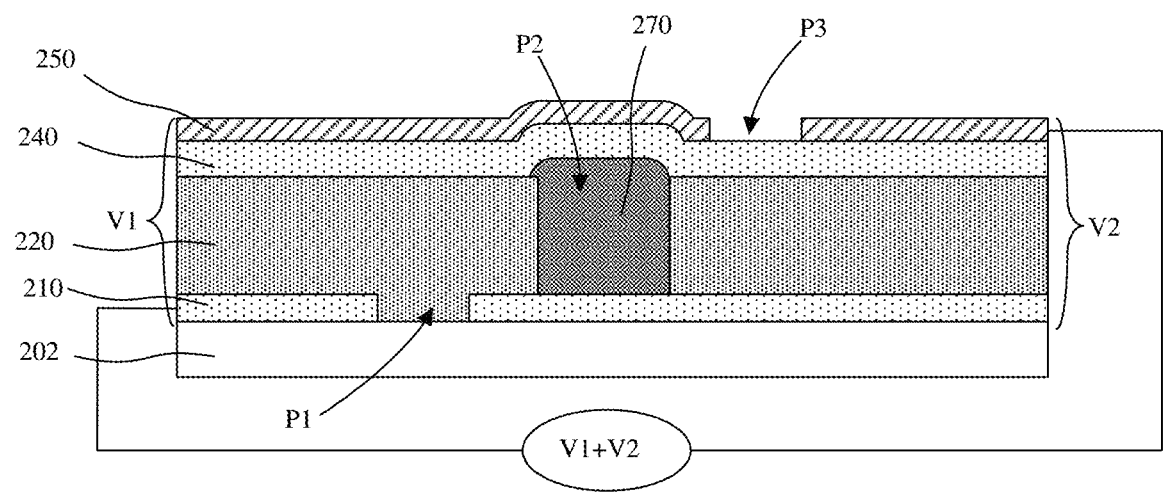
FIG. 16A is a schematic cross-sectional side view illustration of an interconnect with a conductive plug in a subcell patterned line opening in accordance with an embodiment.

FIG. 16A is a schematic cross-sectional side view illustration of an interconnect with a conductive plug in a subcell patterned line opening in accordance with an embodiment. As shown, the solar cell interconnect may include a bottom electrode layer 210, a first patterned line opening P1 in the bottom electrode layer 210, a subcell layer 220 over the bottom electrode layer, a second patterned line opening P2 in the subcell layer 220, a conductive plug 270 within P2, a conformal transport layer 240 over the subcell layer 220 and the conductive plug 270, a top electrode layer 250 over the conformal transport layer 240, and a third patterned line opening P3 in the top electrode layer 250. The conformal transport layer 240 may be continuous. In the embodiment illustrated, P3 does not completely extend through a thickness of the conformal transport layer 240.

Figure 16B:
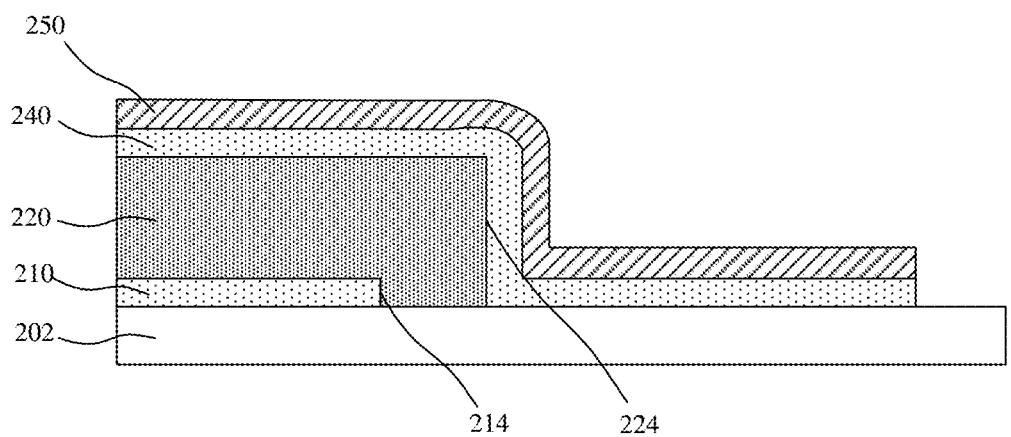
FIG. 16B is a schematic cross-sectional side view illustration of edge encapsulation of a solar cell module including the interconnect of FIG. 16A in accordance with an embodiment.
Figure 17:
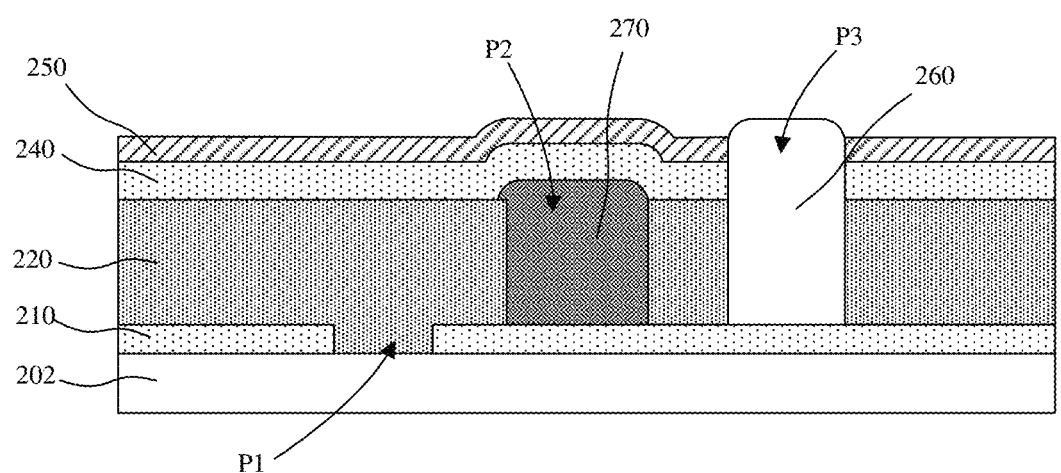
FIG. 17 is a schematic cross-sectional side view illustration of a variation of the interconnect of FIG. 16A with scribed cells in accordance with an embodiment.

FIG. 16B is a schematic cross-sectional side view illustration of edge encapsulation of a solar cell module including the interconnect of FIG. 16A in accordance with an embodiment. Similar to the embodiment illustrated in FIG. 5B, the solar cell module may include a bottom electrode layer 210 including a plurality of first patterned line openings, a subcell layer 220 over the bottom electrode layer 210, the subcell layer including a plurality of second patterned line openings, a conformal transport layer 240 over subcell layer and laterally surrounding an outside perimeter 224 the subcell layer 220, and a patterned top electrode layer 250 over the conformal transport layer 240.

Several variations of the embodiments illustrated in FIGS. 16A-16B are contemplated. For example, referring to FIG. 17, the third patterned line opening P3 may partially or completely extend through any of the top electrode layer 250, the conformal transport layer 240, and the subcell layer 220. As shown, a non-electrically conductive material 260 can fill the third patterning line opening P3. For example, the non-electrically conductive material 260 may be a polymer, metal oxide, or nitride material and may function to prevent metal degradation from where the conformal transport layer 240 is interrupted by the third patterned line opening P3.

Figure 18:
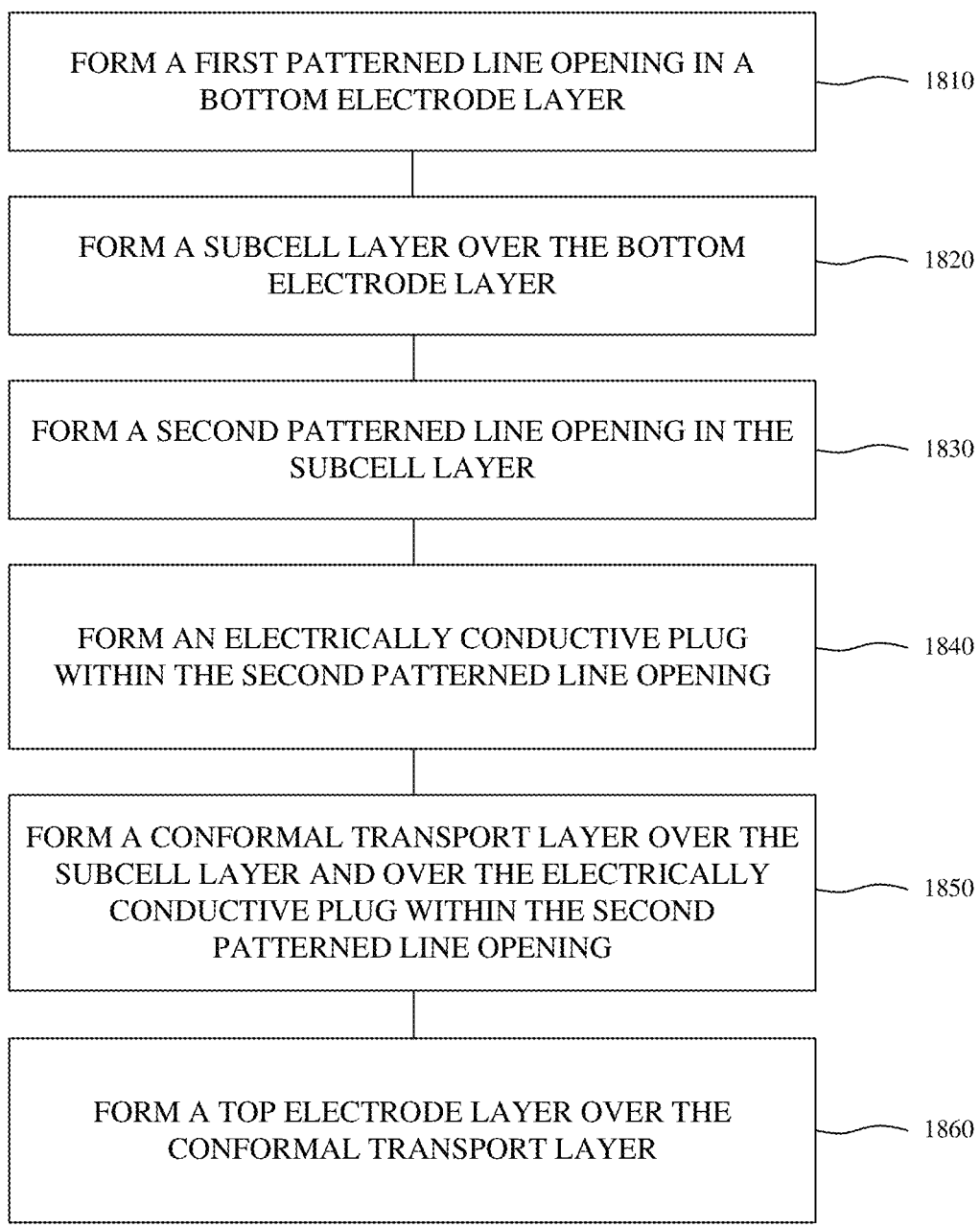
FIG. 18 is flow chart illustrating a method of forming the interconnect of FIG. 16A in accordance with an embodiment.
Figure 19A:
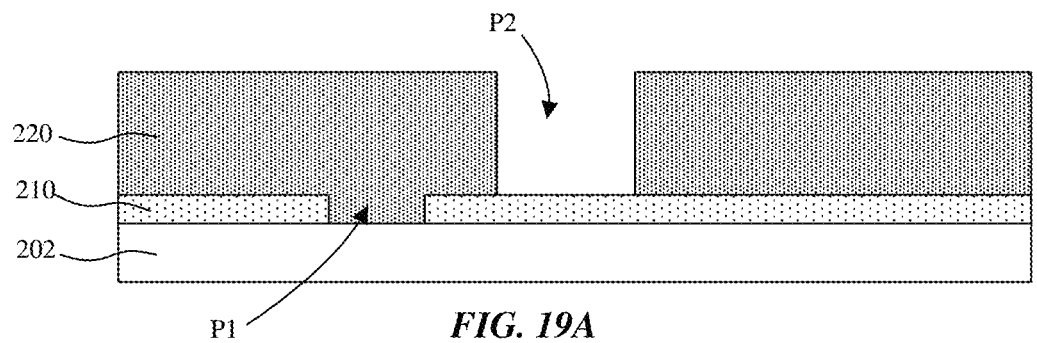
FIGS. 19A-19D are schematic cross-sectional side view illustrations of a method of forming the interconnect of FIG. 16A in accordance with an embodiment.
Figure 19B:
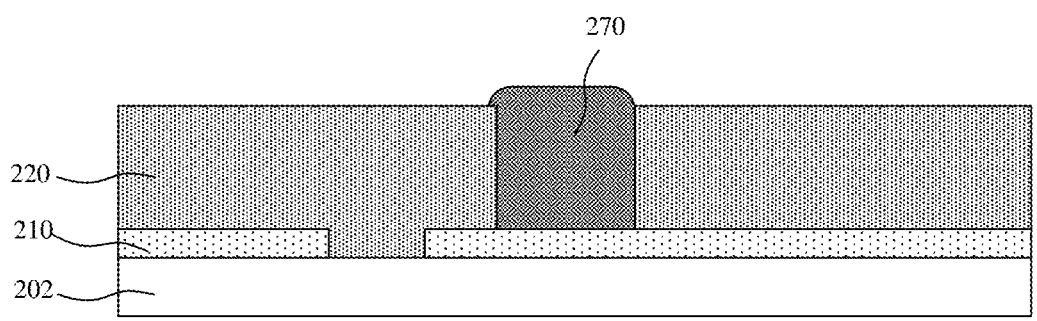
Figure 19C:
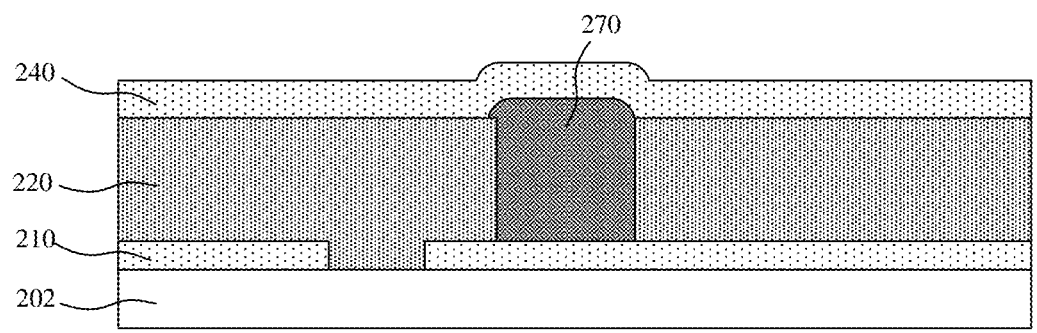
Figure 19D:
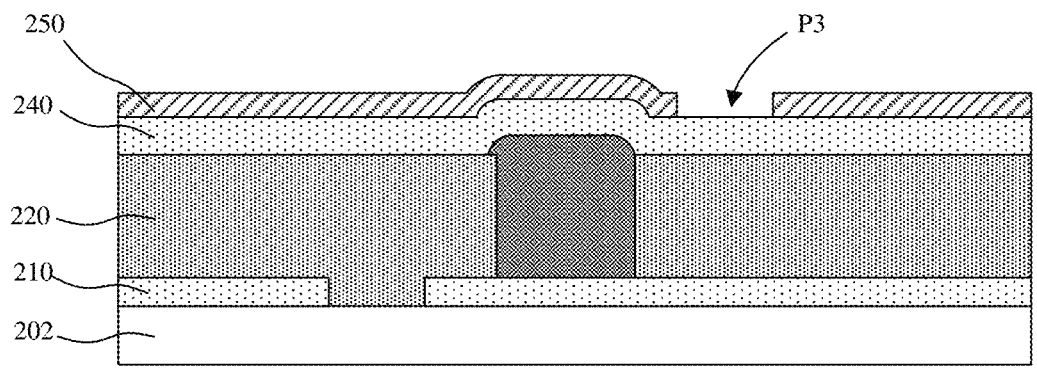

Referring now to FIGS. 18-19D, FIG. 18 is flow chart illustrating a method of forming the interconnect of FIG. 16A in accordance with an embodiment. FIGS. 19A-19D are schematic cross-sectional side view illustrations of a method of forming the interconnect of FIG. 16A in accordance with an embodiment. In the following description, the processing sequence of FIG. 18 is made with regard to the cross-sectional side view illustrations of FIGS. 19A-19D. Additionally, it is understood that certain embodiments may be practiced without one or more of these specific details, or in combination with other known methods and configurations described herein.

The processing sequence may begin similarly as with that of FIG. 7. At operation 1810 a first patterned line opening P1 is formed in the bottom electrode layer 210. At operation 1820 the subcell layer 220 is formed over the patterned bottom electrode layer 210. Referring to FIG. 19A the subcell layer 220 is then patterned to form a second patterned line opening P2 at operation 1830. Referring to FIG. 19B, at operation 1040 an (electrically) conductive plug 270 is formed within P2 and on the bottom electrode layer 210. The conductive plug 270 may be formed of materials that do not react with the absorber layer(s), such as carbon or a carbon/polymer blend, printed ITO nanoparticles or other TCO nanoparticles. The conductive plug 270 may be formed using a suitable printing technique such as ink jet, extrusion, spraying, etc. so that further patterning is not necessary. A conductivity of the conductive plug 270 in accordance with embodiments may only be greater than about 0.001 S/cm due to the short distance of the interconnection based on the thin film thickness in the 0.1-5 µm range. Such a low conductivity can be achieved by a range of materials that do not react with the perovskite such as carbon (bulk conductivity around 1-100 S/cm) and ITO nanoparticles. In an embodiment, the conductive plug 270 includes particles dispersed in a matrix (e.g. polymer matrix). The carbon and/or TCO particles can be mixed into a polymer blend in order to make it easier to suspend the carbon or TCO nanoparticles in a solvent and deposit the interconnects through a printing technique like ink jet or spraying. Due to the low conductivity required, a very high conductive particle to polymer ratio is not required. Such a polymer could be a binder like poly(vinylidene fluoride) (PVDF), polyvinyl fluoride, polyvinylchloride, polystyrene, PMMA, PVA, polyvinyl phenol, polyethylene glycol, etc. The carbon may be graphite or carbon black in an embodiment, but could include graphene or carbon nanotubes or amorphous carbon. The TCO particles may be ITO or IZO nanoparticles with diameters between 10-200 nm in an embodiment, but could be AZO, $Sb:SnO_2$, zinc tin oxide, cadmium stannate and could be microparticles with diameters between 0.2-2 µm.

Referring now to FIG. 19C, at operation 1850 a conformal transport layer 240 is formed over the subcell layer 220 and over the electrically conductive plug 270 within P2. The conformal transport layer 240 may function to encapsulate and protect the subcell layer 220, for example from decomposition and metal diffusion. Suitable deposition techniques to form a conformal layer may include chemical vapor deposition (CVD), atomic layer deposition (ALD), solution coating and evaporation. In an embodiment, the conformal transport layer is less than 150 nm thick, or more specifically less than 50 nm thick such as 10-20 nm thick. The conformal transport layer may be doped. For example, the transport layer may be AZO. The conformal transport layer may be sufficiently thin to transport charge through its thickness, and not be laterally conductive. The conformal transport layer 240 may be characterized by a resistivity greater than 0.1 ohm·cm. In an embodiment, the conformal transport layer also functions as an electron transport layer to the subcell layer 220.

The top electrode layer 250 may then be formed over the conformal transport layer 240 at operation 1860 as illustrated in FIG. 19D. In a particular embodiment, the top electrode layer 250 is deposited through a shadow mask to form the third patterned line opening P3 during deposition. This may protect underlying layers from solution processing operation. Suitable deposition technique may include evaporation, sputter, printing, and spraying. In an embodiment, the top electrode layer 250 includes one or more metal layers, such as Ag, Cu, Al, Au, etc. In an alternative embodiment illustrated in FIG. 17, scribing could be performed to create P3 similarly as described and illustrated with regard to FIG. 6A, followed by at least partially filling with a non-electrically conductive material 260.

Figure 20A:
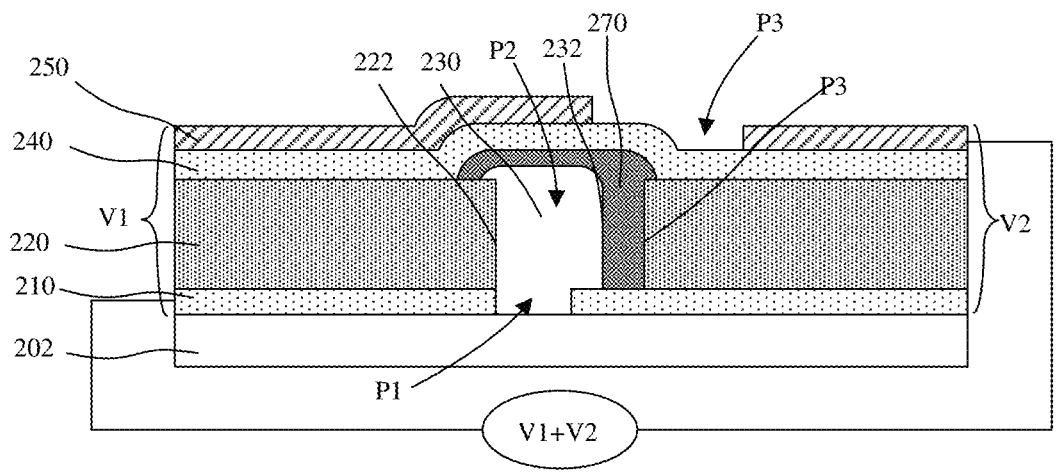
FIGS. 20A-20B are schematic cross-sectional side view illustrations of an interconnect with a printed non-metallic intermediate layer and conductive plug within a subcell patterned line opening in accordance with an embodiment.

FIG. 20A is a schematic cross-sectional side view illustration of an interconnect with a conductive plug in a subcell patterned line opening in accordance with an embodiment. As shown, the solar cell interconnect may include a bottom electrode layer 210, a first patterned line opening P1 in the bottom electrode layer 210, a subcell layer 220 over the bottom electrode layer, a second patterned line opening P2 in the subcell layer 220, a conductive plug 270 within P2, a conformal transport layer 240 over the subcell layer 220 and the conductive plug 270, a top electrode layer 250 over the conformal transport layer 240, and a third patterned line opening P3 in the top electrode layer 250. The conformal transport layer 240 may be continuous. P3 may not completely extend through a thickness of the conformal transport layer 240. In the particular embodiment illustrated P2 overlaps P1. Additionally, a non-metallic intermediate layer 230 may be formed along a single sidewall 222 of P2. Non-metallic intermediate layer 230 may be formed of the same materials as the non-metallic intermediate layer 230 previously described. More specifically, the non-metallic intermediate layer 230 may be formed along a single sidewall 222 of P1 that is shared with P1. The non-metallic intermediate layer 230 may be formed within P1. Additionally, P3 may optionally overlap P2.

In the particular embodiment illustrated in FIG. 20A, a lateral edge 232 of the non-metallic intermediate layer 230 is over the bottom electrode layer 210. The lateral edge 232 may be located elsewhere in accordance with embodiments. For example, the variation illustrated in FIG. 20B shows lateral edge 232 located within P1.

Figure 20B:
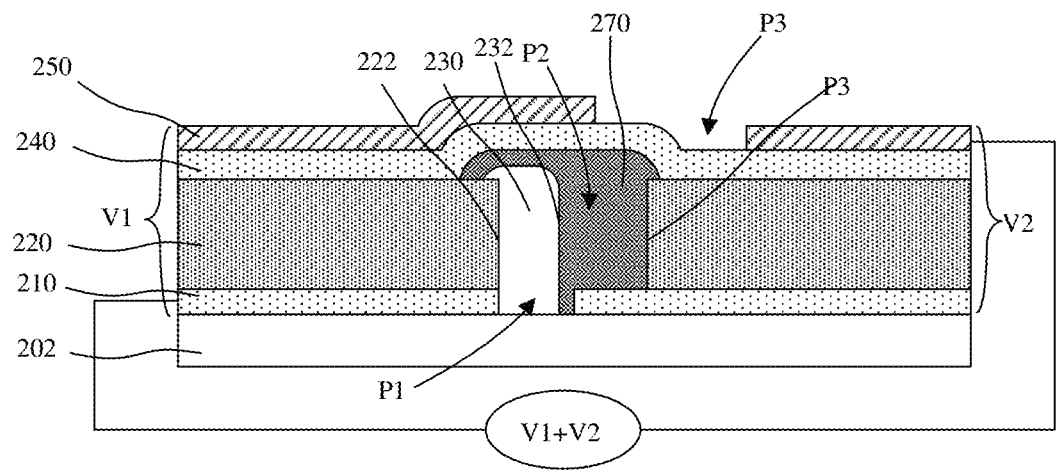
Figure 20C:
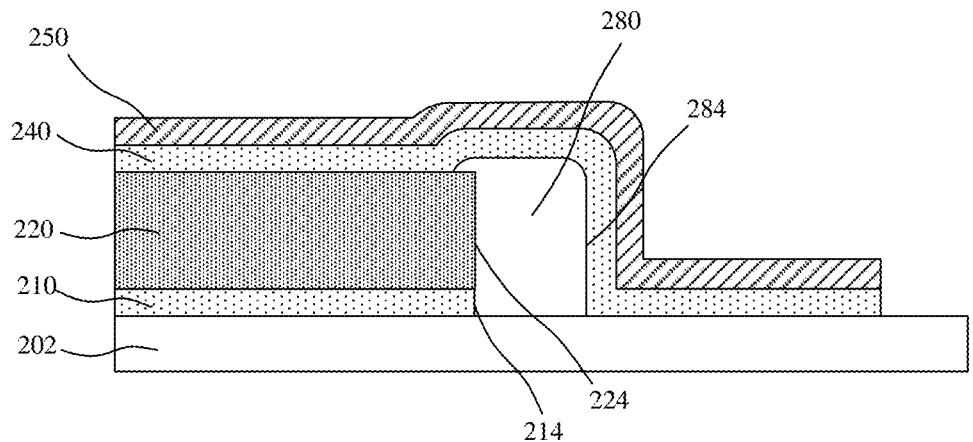
FIG. 20C is a schematic cross-sectional side view illustration of edge encapsulation of a solar cell module including an interconnect of FIG. 20A-20B in accordance with an embodiment.
Figure 21:
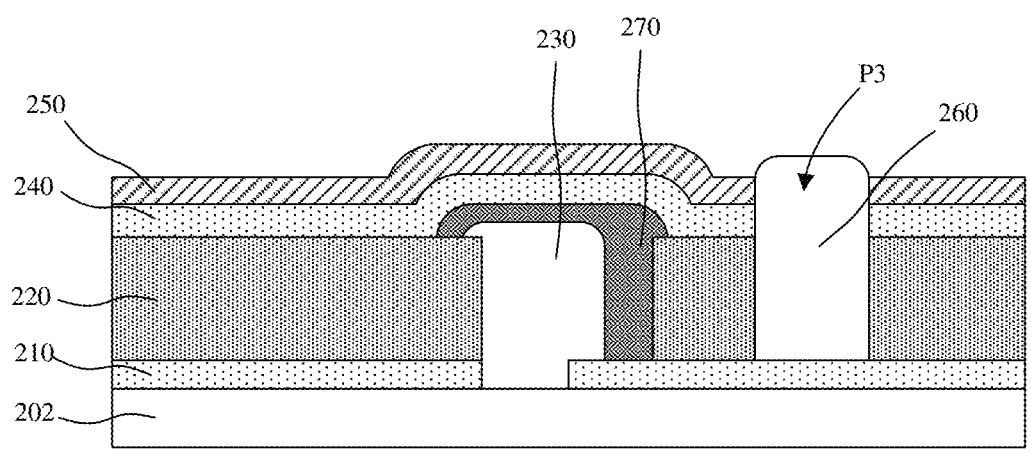
FIG. 21 is a schematic cross-sectional side view illustration of a variation of the interconnect of FIG. 20A with scribed cells in accordance with an embodiment.

FIG. 20C is a schematic cross-sectional side view illustration of edge encapsulation of a solar cell module including an interconnect of FIG. 20A-20B in accordance with an embodiment. Similar to the embodiment illustrated in FIG. 5B, the solar cell module may include a bottom electrode layer 210 including a plurality of first patterned line openings, a subcell layer 220 over the bottom electrode layer 210, the subcell layer including a plurality of second patterned line openings, a conformal transport layer 240 over subcell layer and laterally surrounding an outside perimeter 224 the subcell layer 220, and a patterned top electrode layer 250 over the conformal transport layer 240. In the embodiment illustrated, a non-metallic intermediate layer 230 is located between the conformal transport layer 240 and the subcell layer 220, and the non-metallic intermediate layer 230 laterally surrounds the outside perimeter 224 of the subcell layer 220. Additionally, the conformal transport layer 240 may also surround an outside perimeter 284 of the non-metallic intermediate layer 230.

Several variations of the embodiments illustrated in FIGS. 20A-20C are contemplated. For example, referring to FIG. 21, the third patterned line opening P3 may partially or completely extend through any of the top electrode layer 250, the conformal transport layer 240, and the subcell layer 220. As shown, a non-electrically conductive material 260 can fill the third patterning line opening P3. For example, the non-electrically conductive material 260 may be a polymer, metal oxide, or nitride material and may function to prevent metal degradation from where the conformal transport layer 240 is interrupted by the third patterned line opening P3. In an embodiment the non-electrically conductive material 260 and the non-metallic intermediate layer 230 are formed of the same material.

Figure 22:
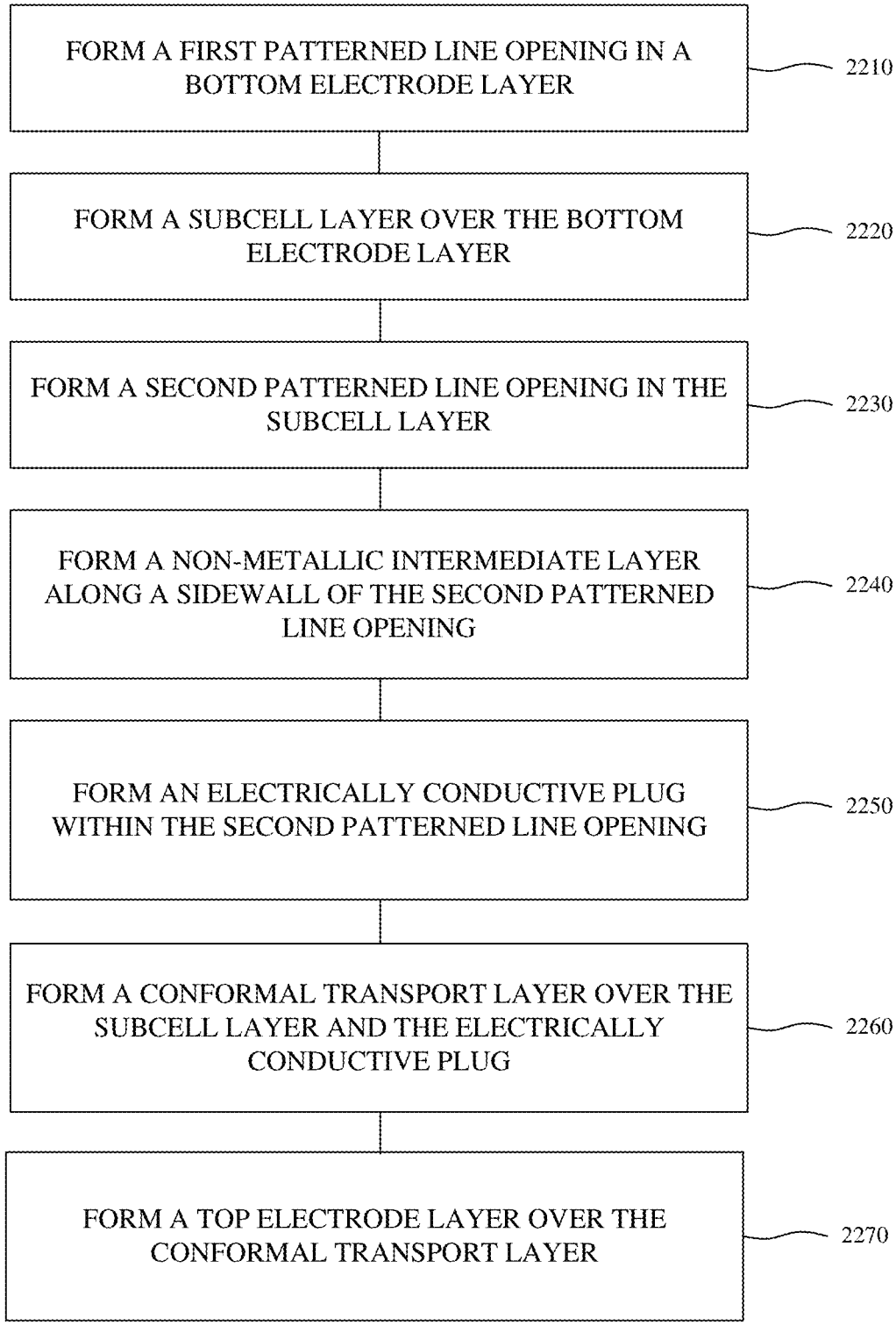
FIG. 22 is flow chart illustrating a method of forming the interconnect of FIG. 20A in accordance with an embodiment.
Figure 23A:
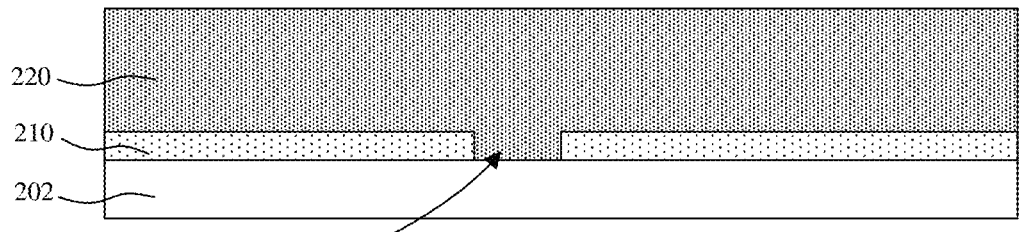
FIGS. 23A-23F are schematic cross-sectional side view illustrations of a method of forming the interconnect of FIG. 20A in accordance with an embodiment.
Figure 23B:
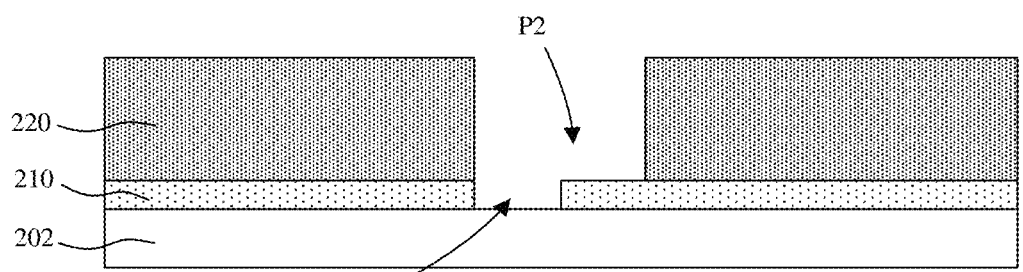
Figure 23C:
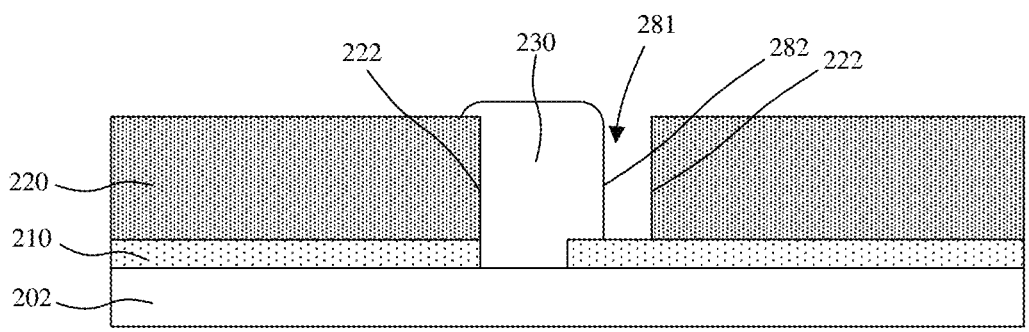
Figure 23D:
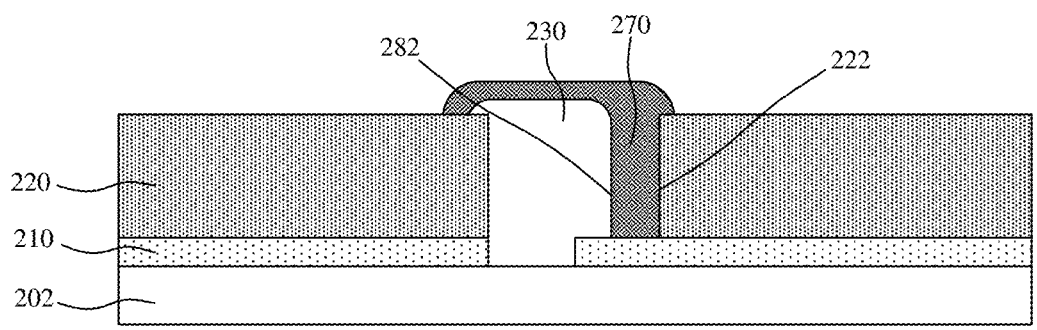
Figure 23E:
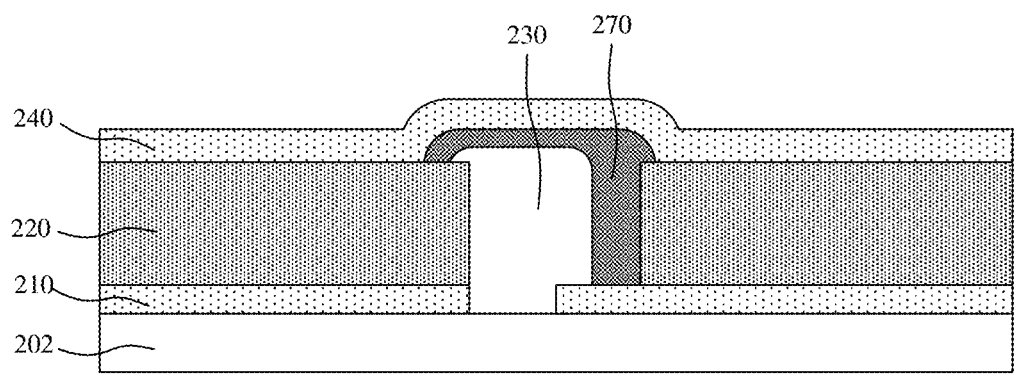
Figure 23F:
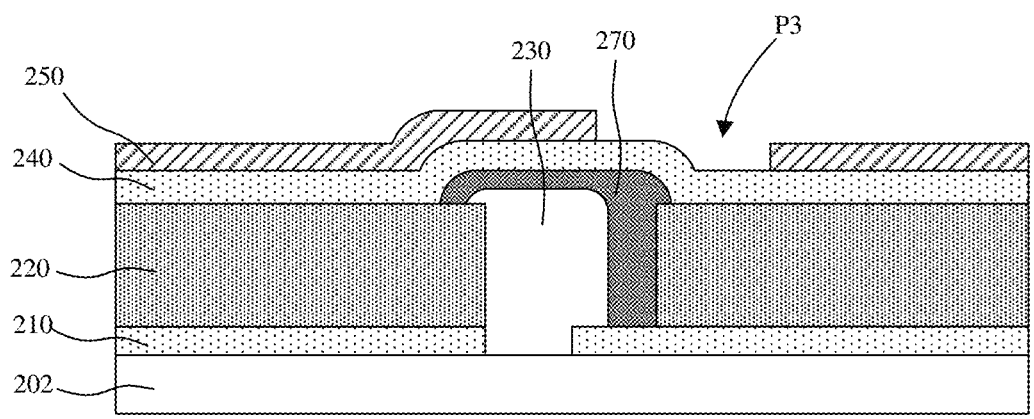

Referring now to FIGS. 22-23F, FIG. 22 is flow chart illustrating a method of forming the interconnect of FIG. 19A in accordance with an embodiment. FIGS. 23A-23F are schematic cross-sectional side view illustrations of a method of forming the interconnect of FIG. 20A in accordance with an embodiment. In the following description, the processing sequence of FIG. 22 is made with regard to the cross-sectional side view illustrations of FIGS. 23A-23F. Additionally, it is understood that certain embodiments may be practiced without one or more of these specific details, or in combination with other known methods and configurations described herein.

The processing sequence may begin similarly as with that of FIG. 7. At operation 2210 a first patterned line opening P1 is formed in the bottom electrode layer 210. At operation 2220 the subcell layer 220 is formed over the patterned bottom electrode layer 210 as shown in FIG. 23A. Referring to FIG. 23B the subcell layer 220 is then patterned to form a second patterned line opening P2 at operation 2230. Referring to FIG. 23C, at operation 2240 a non-metallic intermediate layer 230 is formed along a sidewall 222 of P2. Non-metallic intermediate layer 230 may be formed along a single sidewall 222 in accordance with an embodiment, and as described with regard to FIG. 20A. In an embodiment, non-metallic intermediate layer 230 is a polymer material such as, but not limited to, poly(methyl methacrylate) (PMMA), poly(vinyl alcohol) (PVA), and polystyrene. Non-metallic intermediate layer 230 may be formed using a suitable printing technique such as ink jet, extrusion, spraying, etc. In an embodiment, opening 281 exists between a sidewall 232 of the non-metallic intermediate layer 230 and a sidewall 222 of P2. Opening 281 may expose the bottom electrode 210.

Referring now to FIG. 23D, at operation 2250 a conductive plug 270 is formed within P2, or more specifically within opening 281 within P2. Conductive plug 20 may fill opening 281 between the non-metallic intermediate layer 230 and the sidewall 222 P2 that is laterally opposite the sidewall 222 which is covered by non-metallic intermediate layer 230. In an embodiment, conductive plug 270 is in contact with the bottom electrode layer 210. Conductive plug 270 may optionally be formed over the non-metallic intermediate layer 230. The conductive plug 270 may be formed of materials that do not react with the absorber layer(s), such as carbon or a carbon/polymer blend, ITO nanoparticles, and TCO nanoparticles. The conductive plug 270 may be formed using a suitable printing technique such as ink jet, extrusion, spraying, etc. so that further patterning is not necessary.

Referring now to FIG. 23E, at operation 2260 a conformal transport layer 240 is formed over the subcell layer 220 and over the electrically conductive plug 270 within P2. The conformal transport layer 240 may function to encapsulate and protect the subcell layer 220, for example from decomposition and metal diffusion. Suitable deposition techniques to form a conformal layer may include chemical vapor deposition (CVD), atomic layer deposition (ALD), solution coating and evaporation. In an embodiment, the conformal transport layer is less than 1,000 nm thick, such as less than 150 nm thick, or more specifically less than 50 nm thick such as 10-40 nm thick. The conformal transport layer may be doped. For example, the transport layer may be AZO. The conformal transport layer may be sufficiently thin to transport charge through its thickness, and not be laterally conductive. The conformal transport layer 240 may be characterized by a resistivity greater than 0.1 ohm·cm. In an embodiment, the conformal transport layer also functions as an electron transport layer or hole transport layer for a solar cell 120.

The top electrode layer 250 may then be formed over the conformal transport layer 240 at operation 2270 as illustrated in FIG. 23F. In a particular embodiment, the top electrode layer 250 is deposited through a shadow mask to form the third patterned line opening P3 during deposition. This may protect underlying layers from solution processing operation. Suitable deposition technique may include evaporation, sputter, printing, and spraying. In an embodiment, the top electrode layer 250 includes one or more metal layers, such as Ag, Cu, Al, Au, etc. In an alternative embodiment illustrated in FIG. 21, scribing could be performed to create P3 similarly as described and illustrated with regard to FIG. 6A, followed by at least partially filling with a non-electrically conductive material 260.

Figure 24A:
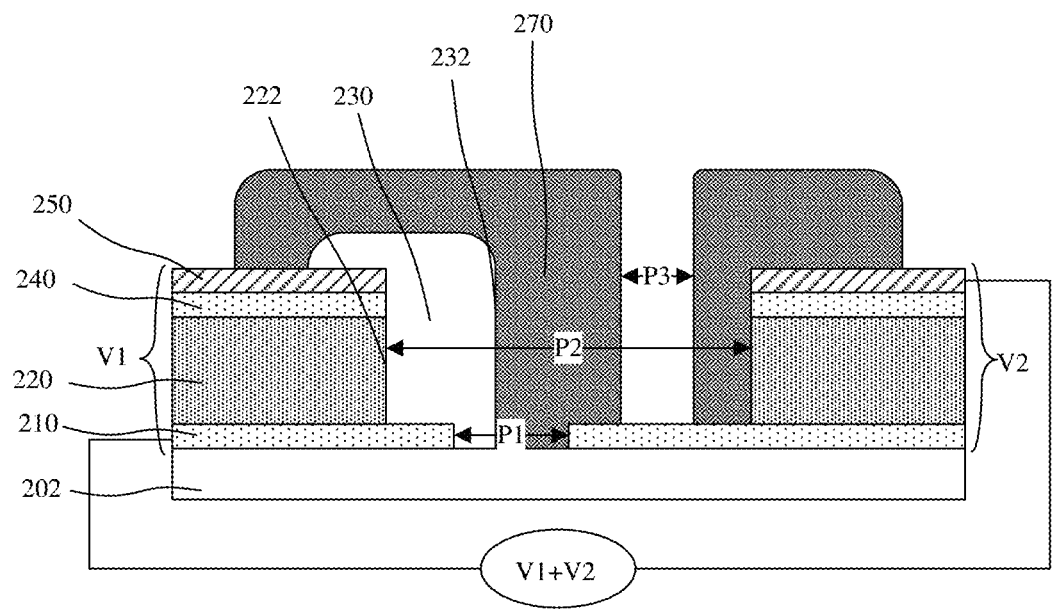
FIGS. 24A-24B are schematic cross-sectional side view illustrations of an interconnect with a printed non-metallic intermediate layer and conductive plug within a subcell patterned line opening in accordance with an embodiment.
Figure 24B:
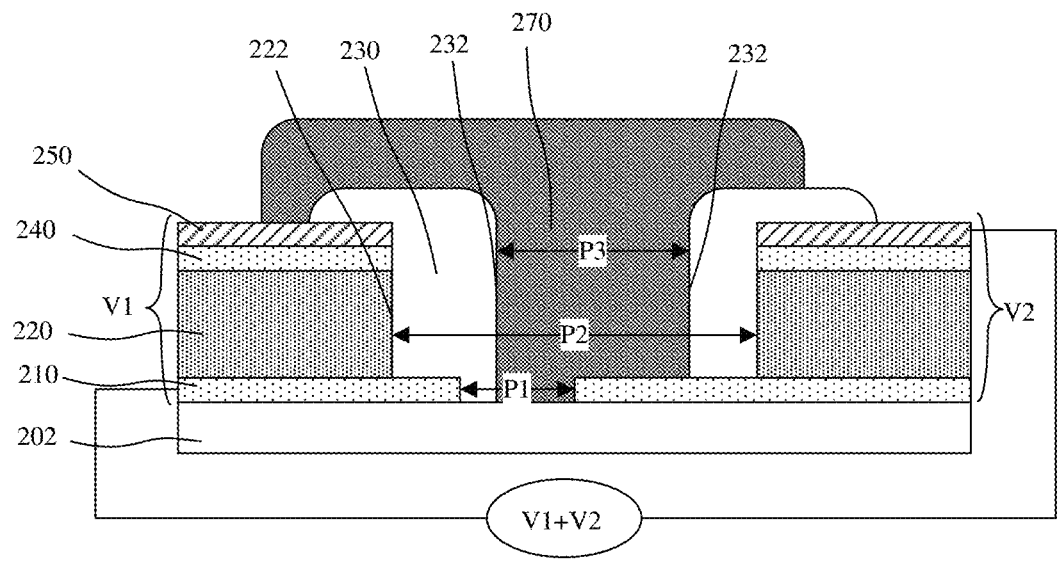
Figure 24C:
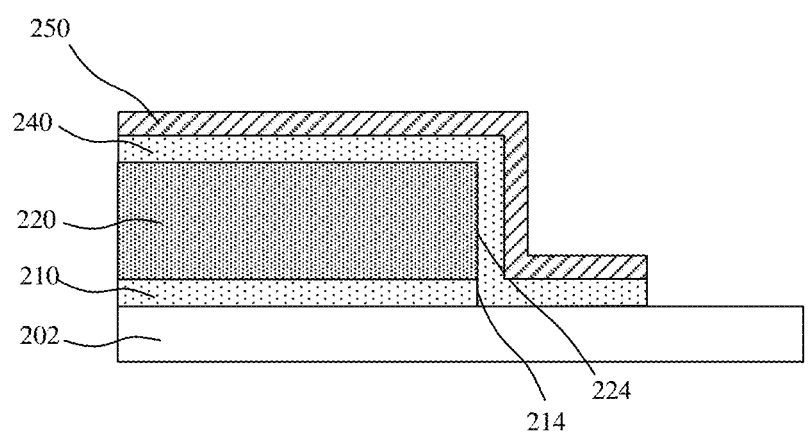
FIG. 24C is a schematic cross-sectional side view illustration of edge encapsulation of a solar cell module including an interconnect of FIG. 24A-24B in accordance with an embodiment.

FIGS. 24A-24B are schematic cross-sectional side view illustrations of an interconnect with a printed non-metallic intermediate layer and conductive plug within a subcell patterned line opening in accordance with an embodiment. FIG. 24C is a schematic cross-sectional side view illustration of edge encapsulation of a solar cell module including an interconnect of FIG. 24A-24B in accordance with an embodiment. As shown, the solar cell interconnect may include a bottom electrode layer 210, a first patterned line opening P1 in the bottom electrode layer, a subcell layer 220 over the bottom electrode layer 210, a conformal transport layer 240 over the subcell layer 220, a top electrode layer 250 over the conformal transport layer 240, and a second patterned line opening P2 through the top electrode layer 250, the conformal transport layer 240 and the subcell layer 220. A conductive plug 270 is formed within the second patterned line opening P2 to make electrical connection between the top electrode layer 250 of one cell and the bottom electrode layer 210 of an adjacent cell. The second patterned line opening P2 may overlap the first patented line opening P1. For example, P2 may completely overlap P1 and be wider than P1.

The conformal transport layer 240 may be a continuous layer prior to patterning of P2. Referring to FIG. 24C, the conformal transport layer 240 may laterally surround the outside perimeter 224 of the subcell layer 220, and optionally outside perimeter 214 of the bottom electrode layer 210. The solar cell interconnect may further include a non-metallic intermediate layer 230 along one or more sidewalls of the second patterned line opening P2. For example, this may be sidewalls 222 of the subcell layer 220, as well as sidewalls of the conformal transport layer 240 and top electrode layer 250. In the embodiment illustrated in FIG. 24A a third patterned line opening P3 is formed in the conductive plug 270 within the second line opening P2. The third patterned line opening P3 may expose the bottom electrode layer 210. In the embodiment illustrated in FIG. 24B the non-metallic intermediate layer 230 is formed on both laterally opposite sidewalls of the second patterned line opening P2, and a third patterned line opening P3 is formed in the non-metallic intermediate layer 230. The third patterned line opening P3 extends into the second patterned line opening P2, and the conductive plug 20 fills the third patterned line opening P3 in the non-metallic intermediate layer. In accordance with embodiments, the top electrode layer 250 of FIGS. 24A-24C can include metal layer, and the bottom electrode layer 210 can include a transparent material.

Figure 25:
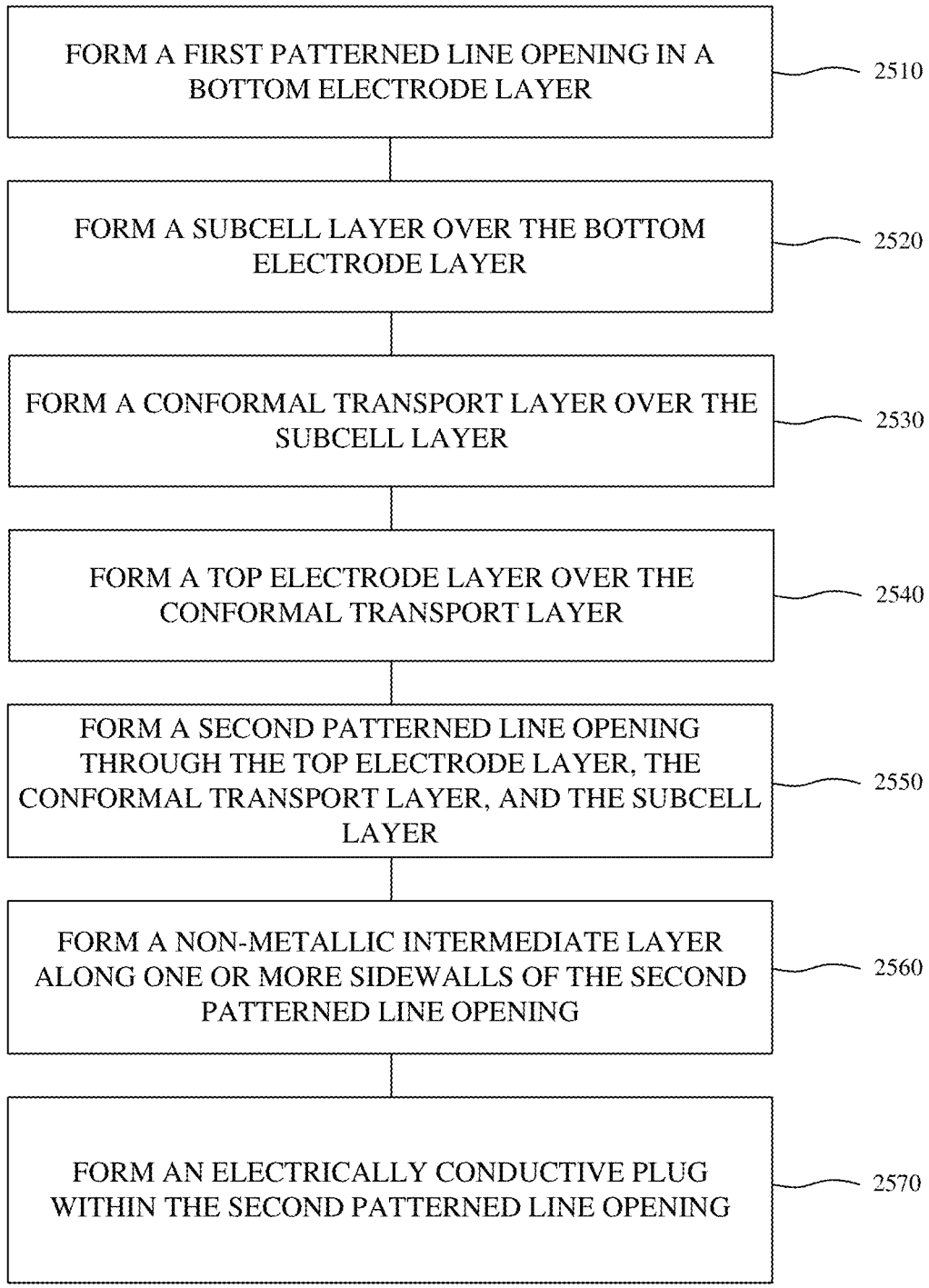
FIG. 25 is flow chart illustrating a method of forming the interconnects of FIGS. 24A-24B in accordance with embodiments.
Figure 26A:
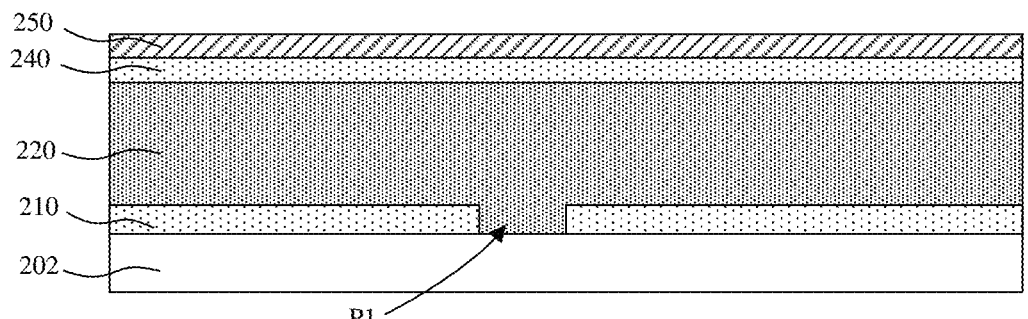
FIGS. 26A-26C are schematic cross-sectional side view illustrations of a method of forming the interconnects of FIGS. 26A-26B in accordance with embodiments.
Figure 26B:
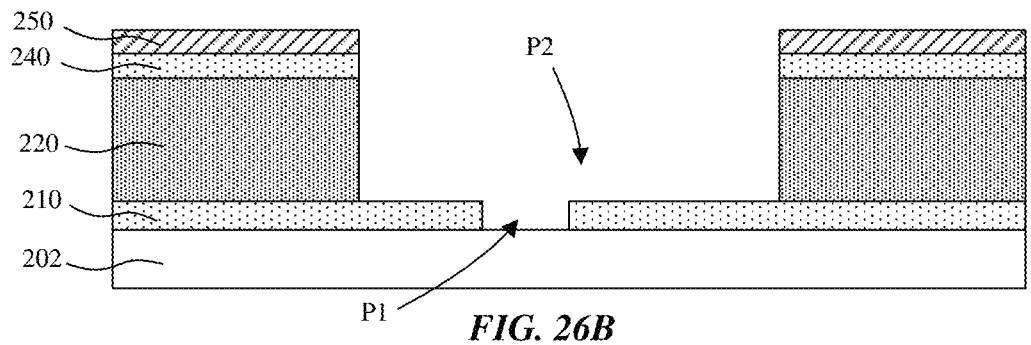
Figure 26C:
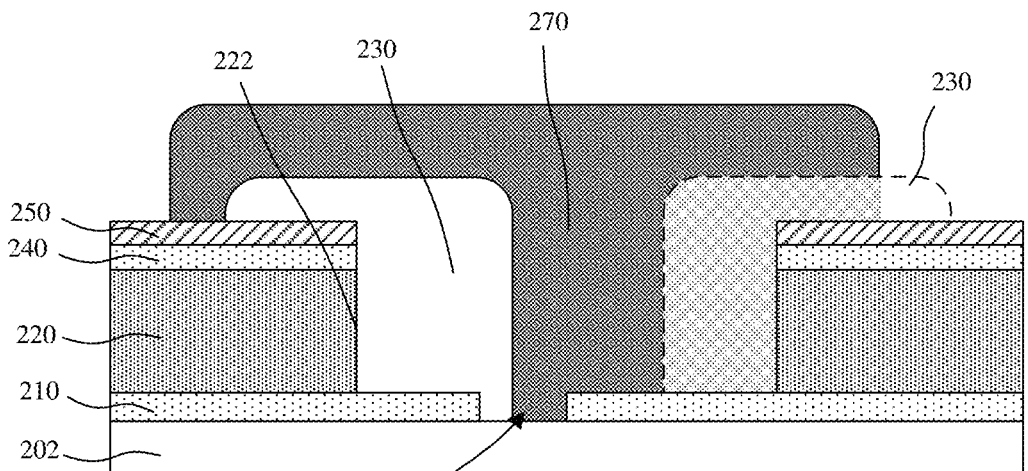

Referring now to FIGS. 25-26C, FIG. 25 is flow chart illustrating a method of forming the interconnects of FIGS. 24A-24B in accordance with embodiments. FIGS. 26A-26C are schematic cross-sectional side view illustrations of a method of forming the interconnects of FIG. 24A-24B in accordance with embodiments. In the following description, the processing sequence of FIG. 25 is made with regard to the cross-sectional side view illustrations of FIGS. 26A-26C. Additionally, it is understood that certain embodiments may be practiced without one or more of these specific details, or in combination with other known methods and configurations described herein.

The processing sequence may begin similarly as with that of FIG. 7. At operation 2510 a first patterned line opening P1 is formed in the bottom electrode layer 210. At operation 2520 the subcell layer 220 is formed over the patterned bottom electrode layer 210. At operation 2530 a conformal transport layer 240 is formed over the subcell layer, and at operation 2540 a top electrode layer 250 is formed over the conformal transport layer 240 as illustrated in FIG. 26A. The conformal transport layer 240 may function to encapsulate and protect the subcell layer 220, for example from decomposition and metal diffusion. Suitable deposition techniques to form a conformal layer may include chemical vapor deposition (CVD), atomic layer deposition (ALD), solution coating and evaporation. In an embodiment, the conformal transport layer is less than 1,000 nm thick, such as less than 150 nm thick, or more specifically less than 50 nm thick such as 10-40 nm thick. The conformal transport layer may be doped. For example, the transport layer may be AZO. The conformal transport layer may be sufficiently thin to transport charge through its thickness, and not be laterally conductive. The conformal transport layer 240 may be characterized by a resistivity greater than 0.1 ohm·cm. In an embodiment, the conformal transport layer also functions as an electron transport layer or hole transport layer for a solar cell 120. The top electrode layer 250 may be formed using suitable deposition technique such as evaporation, sputter, printing, and spraying. In an embodiment, the top electrode layer 250 includes one or more metal layers, such as Ag, Cu, Al, Au, etc.

Referring now to FIG. 26B at operation 2550 a second patterned line opening P2 is then formed through the top electrode layer 250, the conformal transport layer 240, and the subcell layer 220. As shown, the P2 may overlap P1, and may be wider than P1. Formation of P2 may also remove any subcell layer 220 material from within P1.

A non-metallic intermediate layer 230 may then be formed along one, or both, sidewalls of P2 as shown in FIG. 26C. Non-metallic intermediate layer 230 may be formed of the same materials as the non-metallic intermediate layer 230 previously described. Non-metallic intermediate layer 230 may be formed using a suitable printing technique such as ink jet, extrusion, spraying, etc. In an embodiment such as FIG. 24B, a third patterned line opening P3 may be formed in the non-metallic intermediate layer 230. This may be accomplished through the deposition technique. Alternatively this may be accomplished through patterning, such as scribing. This may increase deposition tolerances for the non-metallic intermediate layer 230. In an embodiment such as FIG. 24A, the non-metallic intermediate layer 230 may be formed along a single sidewall of P2. In both configurations the non-metallic intermediate layer 230 can insulate the top electrode layer 250 from the bottom electrode layer 210 after formation of the plug 270.

Referring to FIG. 26C, at operation 2570 an (electrically) conductive plug 270 is formed within P2 and on the bottom electrode layer 210. In the embodiment of FIG. 24A, it is not necessary to further pattern the conductive plug 270. In the embodiment of FIG. 24B, a third patterned line opening P3 may be formed in the conductive plug 270 to prevent shorting across the top electrode layer 250.

The conductive plug 270 may be formed of materials that do not react with the absorber layer(s), such as carbon or a carbon/polymer blend, printed ITO nanoparticles or other TCO nanoparticles. The conductive plug 270 may be formed using a suitable printing technique such as ink jet, extrusion, spraying, etc. so that further patterning is not necessary. A conductivity of the conductive plug 270 in accordance with embodiments may only be greater than about 0.001 S/cm due to the short distance of the interconnection based on the thin film thickness in the 0.1-5 µm range. Such a low conductivity can be achieved by a range of materials that do not react with the perovskite such as carbon (bulk conductivity around 1-100 S/cm) and ITO nanoparticles. In an embodiment, the conductive plug 270 includes particles dispersed in a matrix (e.g. polymer matrix). The carbon and/or TCO particles can be mixed into a polymer blend in order to make it easier to suspend the carbon or TCO nanoparticles in a solvent and deposit the interconnects through a printing technique like ink jet or spraying. Due to the low conductivity required, a very high conductive particle to polymer ratio is not required. Such a polymer could be a binder like poly(vinylidene fluoride) (PVDF), polyvinyl fluoride, polyvinylchloride, polystyrene, PMMA, PVA, polyvinyl phenol, polyethylene glycol, etc. The carbon may be graphite or carbon black in an embodiment, but could include graphene or carbon nanotubes or amorphous carbon. The TCO particles may be ITO or IZO nanoparticles with diameters between 10-200 nm in an embodiment, but could be AZO, $Sb:SnO_2$, zinc tin oxide, cadmium stannate and could be microparticles with diameters between 0.2-2 μm.

In utilizing the various aspects of the embodiments, it would become apparent to one skilled in the art that combinations or variations of the above embodiments are possible for forming a solar cell module and stable interconnect. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A solar cell interconnect comprising:
   a bottom electrode layer;
   a first patterned line opening in the bottom electrode layer;
   a subcell layer over the bottom electrode layer;
   a second patterned line opening in the subcell layer;
   a conductive plug substantially located within the second patterned line opening;
   a conformal transport layer over and directly on the subcell layer and the conductive plug;
   a top electrode layer over the conformal transport layer; and a third patterned line opening in the top electrode layer.

2. The solar cell interconnect of claim 1, further comprising a non-metallic intermediate layer along a single sidewall of the second patterned line opening.

3. The solar cell interconnect of claim 2, wherein the second patterned line opening overlaps the first patterned line opening.

4. The solar cell interconnect of claim 3, wherein the non-metallic intermediate layer is within the first patterned line opening.

5. The solar cell interconnect of claim 3, wherein the third pattered line opening overlaps the second patterned line opening.

6. The solar cell interconnect of claim 1, wherein the top electrode layer comprises a metal layer, and the bottom electrode layer comprises a transparent material.

7. The solar cell interconnect of claim 1, wherein the subcell layer includes a perovskite absorber layer.

8. The solar cell interconnect of claim 1, wherein the conductive plug comprises particles dispersed in a matrix.

9. The solar cell interconnect of claim 1, wherein the subcell layer includes a tandem structure including multiple subcells.

10. The solar cell interconnect of claim 9, wherein the conformal transport layer comprises a material selected from the group consisting of a metal oxide, a metal nitride, and a polymer.

11. The solar cell interconnect of claim 10, wherein the conformal transport layer is less than 150 nm thick.

12. The solar cell interconnect of claim 1, wherein the conformal transport layer is characterized by a resistivity greater than 0.1 ohm·cm.

13. The solar cell interconnect of claim 1, wherein the third patterned line opening does not completely extend through a thickness of the conformal transport layer.

14. The solar cell interconnect of claim 1, wherein the third patterned line opening extends through the top electrode layer, the conformal transport layer, and the subcell layer; and further comprising a non-electrically conductive filling the third patterned line opening.

15. The solar cell interconnect of claim 1, wherein the conformal transport layer spans completely across the second patterned line opening.

16. The solar cell interconnect of claim 15, wherein the conductive plug substantially fills the second patterned line opening.

17. The solar cell interconnect of claim 1, wherein the conductive plug is formed of carbon or a carbon/polymer blend.

18. The solar cell interconnect of claim 1, wherein the conductive plug is formed of transparent conductive oxide (TCO) or a TCO/polymer blend.

* * * * *